United States Patent [19]

Sakai et al.

[11] Patent Number: 4,654,884
[45] Date of Patent: Mar. 31, 1987

[54] RADIO RECEIVER WITH SWITCHING CIRCUIT FOR ELIMINATION OF INTERMODULATION INTERFERENCE

[75] Inventors: Tsuneo Sakai; Tadashi Tanihira; Yoshio Ito, all of Iwaki, Japan

[73] Assignee: Alps Electric Co., Ltd., Japan

[21] Appl. No.: 733,593

[22] Filed: May 10, 1985

[30] Foreign Application Priority Data

| May 10, 1984 | [JP] | Japan | 59-68508[U] |
| May 10, 1984 | [JP] | Japan | 59-68509[U] |
| May 10, 1984 | [JP] | Japan | 59-68510[U] |
| May 10, 1984 | [JP] | Japan | 59-68511[U] |
| May 10, 1984 | [JP] | Japan | 59-68512[U] |
| May 10, 1984 | [JP] | Japan | 59-68507[U] |
| May 17, 1984 | [JP] | Japan | 59-72310[U] |

[51] Int. Cl.[4] .......................................... H04B 1/16
[52] U.S. Cl. .................................. 455/183; 455/200; 455/266; 455/295
[58] Field of Search ............... 455/140, 141, 164, 165, 455/182, 183, 186, 200, 205, 266, 295, 260

[56] References Cited

U.S. PATENT DOCUMENTS

| 3,872,387 | 3/1975 | Banach | 455/266 |
| 4,124,817 | 11/1978 | Takahashi | 455/266 |
| 4,352,208 | 9/1982 | Schroeder | 455/266 |
| 4,355,414 | 10/1982 | Inoue | 455/200 |
| 4,356,567 | 10/1982 | Eguchi et al. | 455/200 |
| 4,361,906 | 11/1982 | Sakamoto | 455/183 |

FOREIGN PATENT DOCUMENTS 4270 1/1983 Japan.

Primary Examiner—Jin F. Ng
Attorney, Agent, or Firm—Guy W. Shoup

[57] ABSTRACT

A radio receiver includes a first tuner, a first intermediate-frequency amplifier, at least two intermediate-frequency filters connected between the first tuner and the first intermediate-frequency amplifier and having difference frequency bands, a switching circuit for applying an output signal from the first tuner through a selected one of the intermediate-frequency filters to the first intermediate-frequency amplifier, an automatic gain control circuit for controlling the gain of the first tuner, a first phase-locked loop for enabling a local oscillator in the first tuner to oscillate at a frequency dependent on the frequency of a desired channel, a second tuner, a level detector circuit for detecting the level of an output signal from the second tuner, a second phase-locked loop for enabling a local oscillator in the second tuner to oscillate at a prescribed frequency, and a controller for controlling the first phase-locked loop to enable the first tuner to receive and issue a desired signal from a desired channel, for controlling the second phase-locked loop to enable the second tuner to receive and issue signals from the desired channel and other channels, for enabling the level detector circuit to detect the levels of the received signals of the channels, for selecting the one of the intermediate-frequency filters based on the detected levels of received signals, and for controlling the automatic gain control circuit.

6 Claims, 33 Drawing Figures

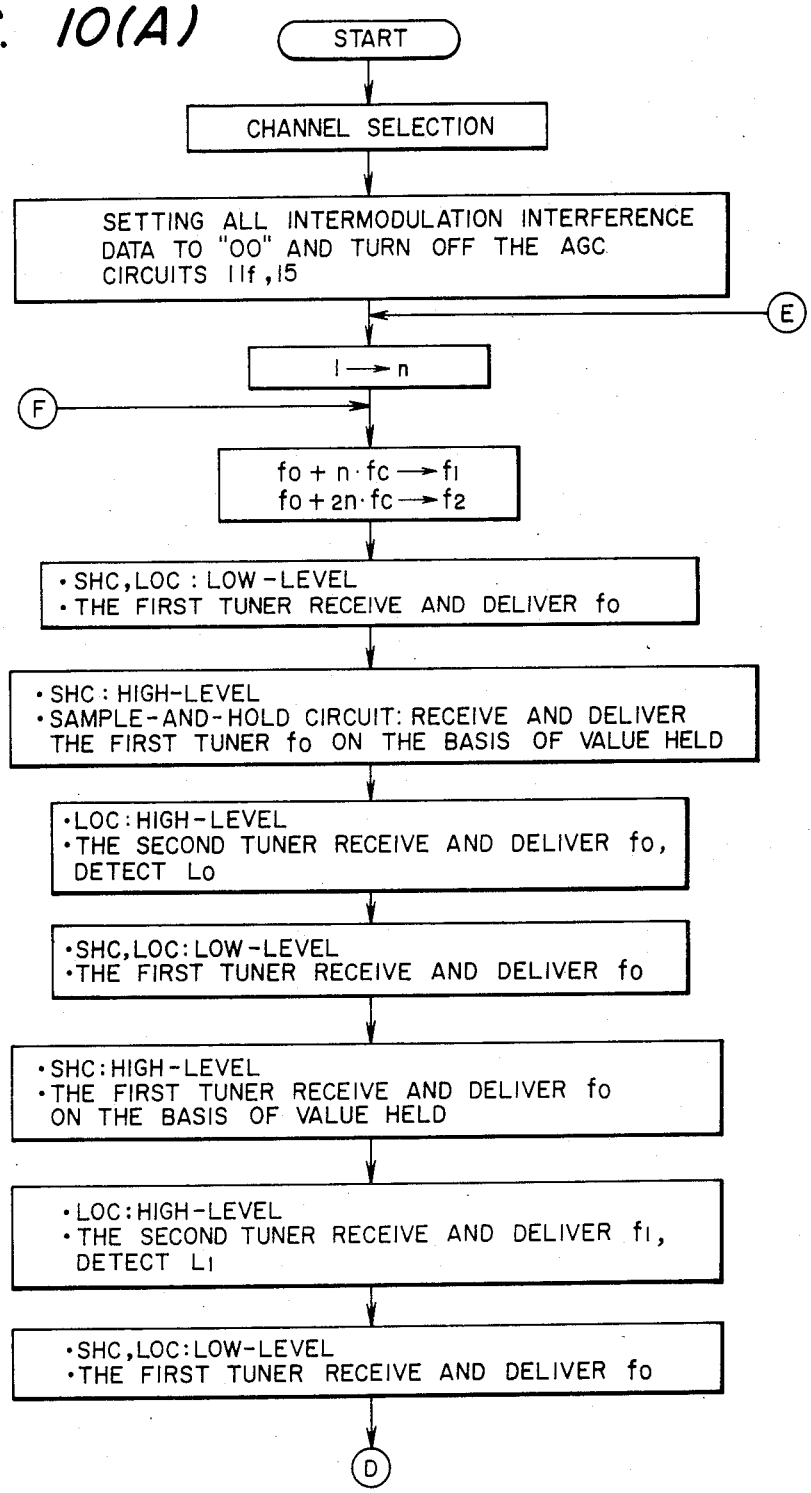

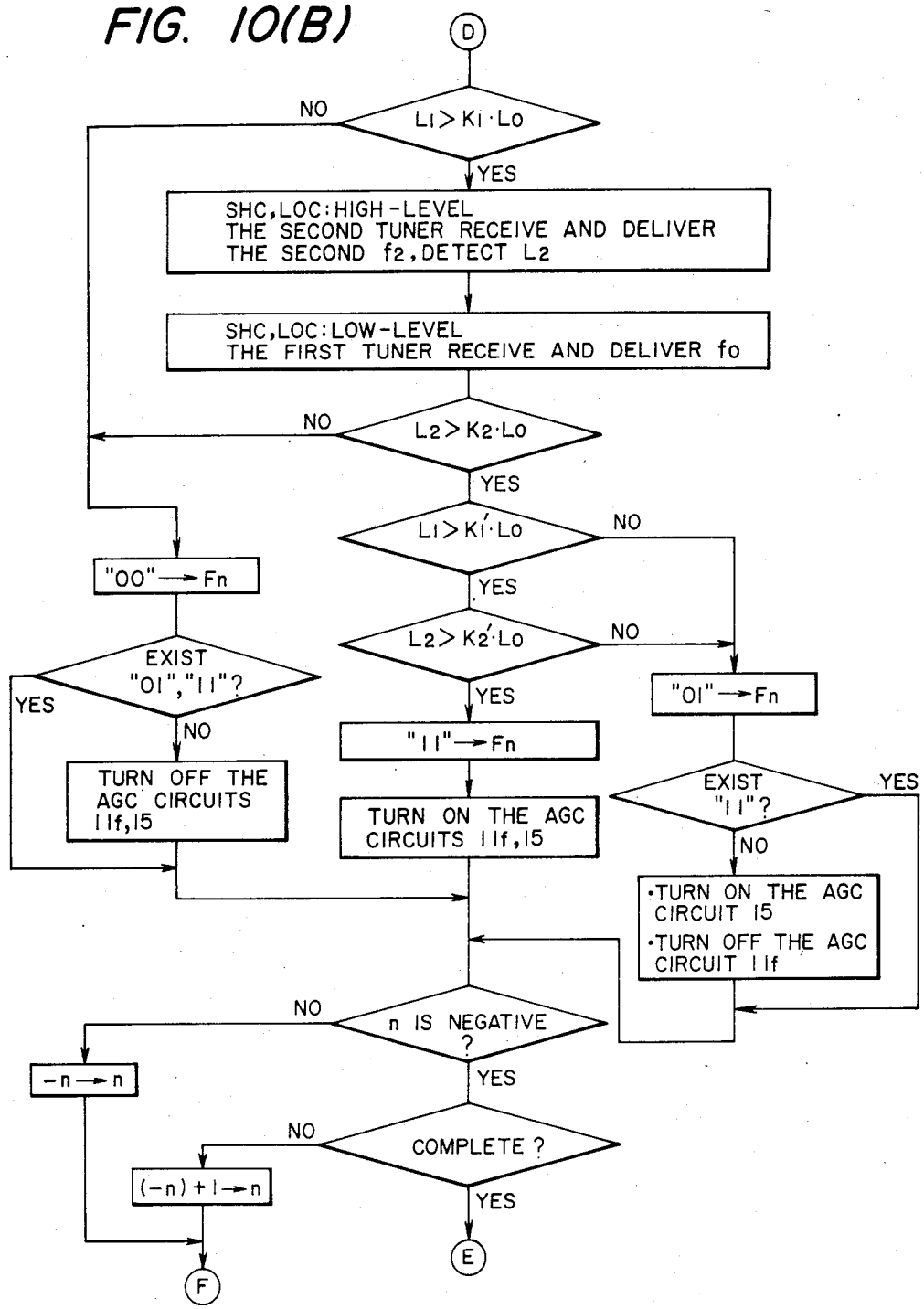

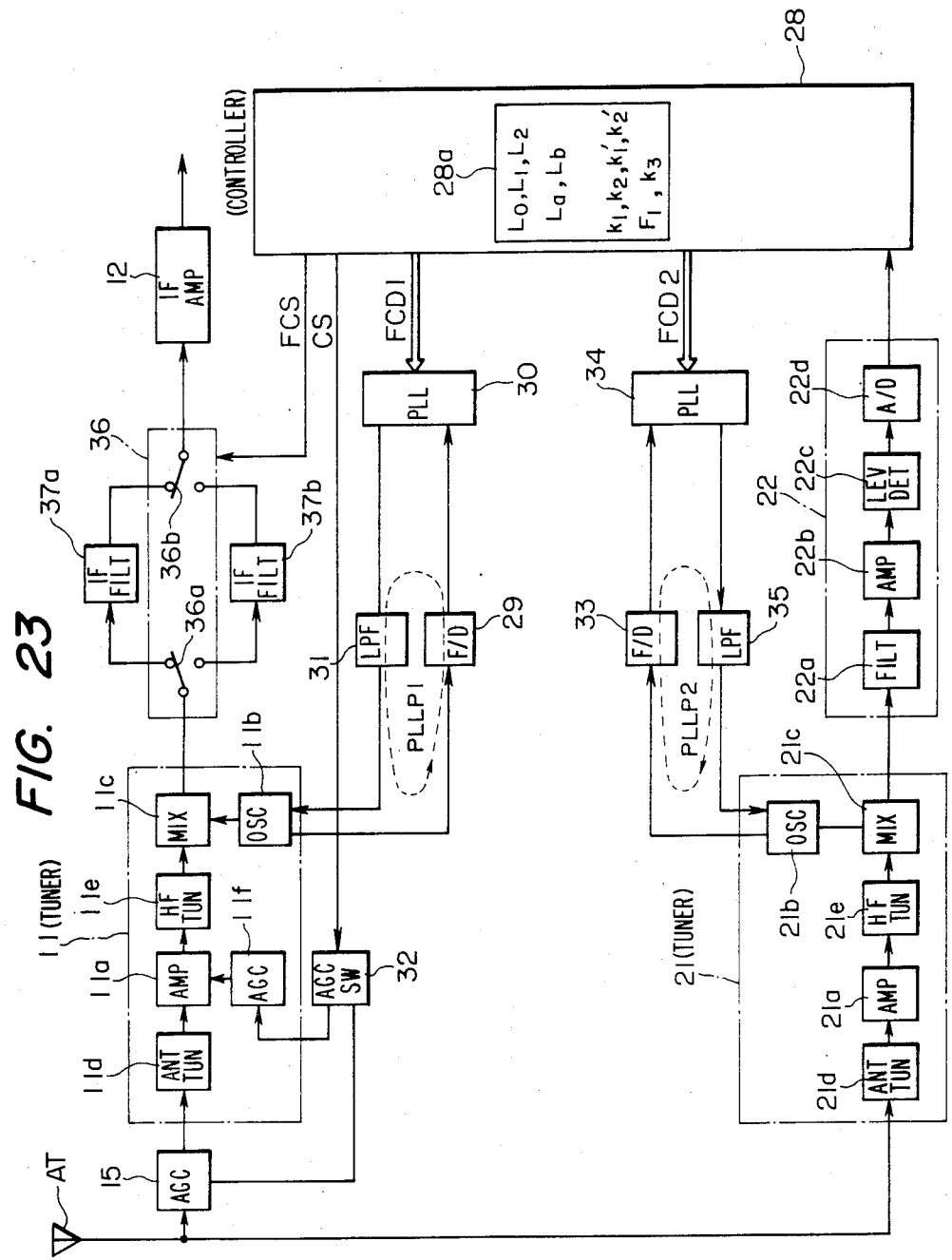

# RADIO RECEIVER WITH SWITCHING CIRCUIT FOR ELIMINATION OF INTERMODULATION INTERFERENCE

BACKGROUND OF THE INVENTION

1. Field of the invention

The present invention relates to a radio receiver, and more specifically to a radio receiver capable of good signal reception while reducing any adverse effects due to intermodulation interference. The present invention is directed more specifically to a radio receiver having at least two intermediate filters of different frequency bands disposed between a tuner and an intermediate-frequency amplifier, the intermediate filters being automatically selectable dependent on the levels of signal reception in a channel being received and an adjacent interfering channel for applying an output signal from the tuner through the selected intermediate filter to the intermediate-frequency amplifier.

2. Description of the Prior Art

As shown in FIG. 1 of the accompanying drawings, a radio receiver such as an FM radio receiver has a tuner (front end) 11, an intermediate-frequency amplifier 12, an FM detector 13, a stereo demodulator 14, and an automatic gain control (AGC) circuit 15. The tuner 11 is composed of a high-frequency amplifier circuit 11a for amplifying an input signal from an antenna AT, a local oscillator 11b, and a mixing detector 11c. The AGC circuit 15 serves to control the gain of the high-frequency amplifier circuit 11a dependent on the level of an intermediate-frequency signal extracted from the intermediate-frequency amplifier 12.

The FM radio receiver will be subjected to jamming while receiving a signal from a desired broadcasting channel if two or more strong radio waves are applied to produce the same frequency as that of the signal of the desired channel. Such jamming is called intermodulation interference, which meets the relationship:

$$f_0 = 2f_1 - f_2$$

where $f_0$ is the frequency of the signal from the desired channel, $f_1$ and $f_2$ the frequencies of the signals from first and second channels, respectively, causing intermodulation interference. The intermodulation interference occurs when the levels of the jamming signals are higher than the level of the signal of the desired channel.

There is known a radio receiver in which a wide-band filter or a narrow-band filter is disposed between a tuner and an intermediate-frequency amplifier. The radio receiver with the wide-band filter only allows signal interference when there is an adjacent channel of a considerably large output capability. The radio receiver with the narrow-band filter only is subjected to distorsion due to over-modulation and poor separation. To avoid these shortcomings, there has been proposed a radio receiver with an automatic intermediate-frequency-band switching capability in-which at least two intermediate-frequency filters (IF filters) disposed between a tuner and an intermediate-frequency amplifier and having different frequency bands. While there is no signal interference from any adjacent broadcasting channel, the IF filter of a wider frequency band is used to receive a signal for reproducing sounds with less distortion. When there is jamming, the IF filter of a narrower frequency band is used to receive a jamming-free signal at the cost of the quality of reproduced sounds.

The conventional FM radio receiver operates in an automatic gain control mode at all times regardless of intermodulation interference. Therefore, it has been difficult to obtain an appropriate AGC which takes into account intermodulation interference. If an AGC setting is too low, then interference occurs, and if the radio receiver has too high an AGC setting, then it suffers from poor sensitivity. Where an FM radio receiver is carried on a moving object such as an automobile, the condition of intermodulation interference tends to vary with time to produce jamming, and it is necessary to lower the signal reception sensitivity at all times for preventing such jamming. Therefore, it has been impossible for the car-mounted FM radio receiver to have good signal reception dependent on the condition of intermodulation interference as it varies from time to time.

Prior radio receivers with automatic IF-band switching capability require a level detector circuit for detecting the level of an interference signal of each of adjacent channels, and a discriminator circuit for determining whether jamming has occurred or the extent of jamming, resulting in a high production cost.

There has been proposed a radio receiver with automatic IF-band switching capability in which detector circuits are connected respectively to IF filters disposed between a tuner and an IF amplifier, and the levels of output signals from the detector circuits are compared to compare the levels of a desired signal and jamming signals for thereby determining whether there is signal interference or not. However, the proposed radio receiver fails to determine accurately whether there is signal jamming. Furthermore, since the levels of the desired and jamming signals are picked up through the IF filters on a reception signal line, limitations are imposed on the characteristics of the IF filters. Another problem is that additional IF filters complicate the construction of a level comparator circuit at a successive stage.

SUMMARY OF THE INVENTION

It is a first object of the present invention to provide a radio receiver capable of effecting appropriate AGC taking into account intermodulation interference.

A second object of the present invention is to provide a radio receiver capable of effecting appropriate AGC depending on the intermodulation interference as it varies from time to time by lowering signal reception sensitivity to prevent signal jamming through AGC when the level of intermodulation interference is high, or increasing signal reception sensitivity to provide good signal reception without effecting AGC when the level of intermodulation interference is low, thereby automatically setting an optimum signal receiving condition.

A third object of the present invention is to provide a radio receiver suitable for being mounted on a moving object such as an automobile.

A fourth object of the present invention is to provide a radio receiver of a simple arrangement with an automatic intermediate-frequency-band switching capability, the radio receiver being devoid of any level detector circuit for detecting the level of a jamming signal from each adjacent channel and any discriminator circuit.

A fifth object of the present invention is to provide a radio receiver with an automatic intermediate-frequency-band switching capability, the radio receiver being capable of accurately comparing the levels of desired and jamming signals, and being of a simple arrangement even with many IF filters.

A sixth object of the present invention is to provide a radio receiver with an automatic intermediate-frequency-band switching capability, the radio receiver being capable of detecting the levels of received jamming signals from adjacent jamming channels without affecting the reception of a desired signal in any way, thus eliminating any sound interruption or abnormal sound which would otherwise be caused by the detection of the levels of the received jamming signals.

A seventh object of the present invention is to provide a radio receiver capable of effecting appropriate AGC taking into account intermodulation interference, of reliably checking if there is signal interference from an adjacent jamming channel, and hence of selecting an appropriate IF filter.

An eighth object of the present invention is to provide a radio receiver having a common circuit arrangement for determining whether there is intermodulation interference produced, whether there is interference from an ajacent jamming channel, effecting AGC, and effecting the selection of an IF filter.

According to the present invention, a radio receiver has a first tuner, a first intermediate-frequency amplifier, at least two intermediate-frequency filters disposed between the first tuner and the first intermediate-frequency amplifier and having different frequency bands, a switching circuit for applying an output signal from the first tuner through one of the intermediate-frequency filters to the first intermediate-frequency amplifier, an automatic gain control circuit for controlling the gain of the first tuner, a first phase-locked loop for enabling a local oscillator in the first tuner to oscillate at a frequency dependent on the frequency of a desired broadcasting channel, a second tuner, a level detector circuit for detecting the level of an output signal from the second tuner, a second phase-locked loop for enabling a local oscillator in the second tuner to oscillate at a prescribed frequency, and a controller for controlling the first phase-locked loop to enable the first tuner to receive and issue a desired signal from the desired broadcasting channel, for controlling the second phase-locked loop to enable the second tuner to receive and issue signals from the desired broadcasting channel and other broadcasting channels, for receiving the levels of the received signals of the broadcasting channels from the level detector circuit, for selecting said one of the intermediate-frequency filters based on the levels of received signals from the broadcasting channels, and for controlling the automatic gain control circuit. The radio receiver may also includes a sample-and-hold circuit for sampling and holding an output signal from a phase-locked loop circuit so that the latter can be shared by the first and second phase-locked loops. Furthermore, the radio receiver may have a single tuner, instead of the first and second tuners, for receiving the signals from the other broadcasing channels at prescribed periods. With this invention, a common circuit arrangement is capable of determining whether there is intermodulation interference produced, whether there is interference from an adjacent jamming channel, effecting AGC, and effecting the selection of an IF filter.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIGS. 10A and B are flowcharts of AGC operation for the second FM radio receiver;

FIG. 23 is a block diagram of a seventh FM radio receiver according to a seventh embodiment of the present invention;

DESCRIPTION OF THE PREFERRED EMBODIMENTS

Figure 1:
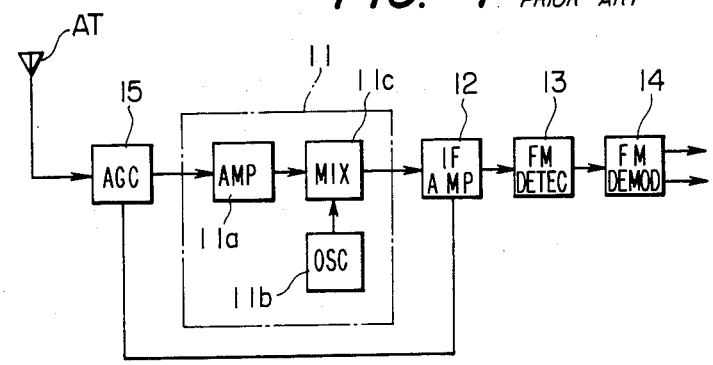
FIG. 1 is a block diagram of a conventional FM radio receiver.

Like or corresponding parts are denoted by like or corresponding reference characters throughout several views.

Figure 2:
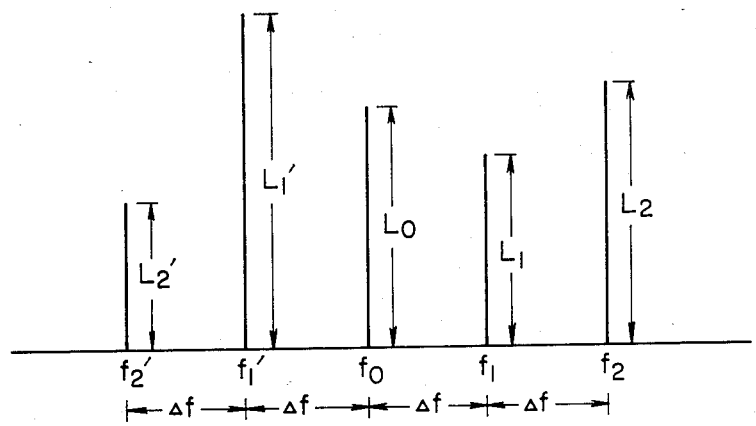
FIG. 2 is a diagram explanatory of intermodulation interference.

FIG. 2 shows a frequency pattern illustrative of conditions in which intermodulation interference is produced. Designated therein at $f_0$, $f_1$ $(=f_0+\Delta f)$, $f_2$ $(=f_0+2\Delta f)$, $f_1'(=f_0-\Delta f)$, and $f_2'$ $(=f_0-2\Delta f)$ are the frequencies of signals received from FM broadcasting channels, and $L_0$, $L_1$, $L_2$, $L_1'$, $L_2'$ the levels of the signals from the FM broadcasting channels. There is a relationship: $\Delta f = n \cdot f_c$ (where $f_c$ is a channel base and n is an integer), and broadcasting channels involved in intermodulation interference are not limited to four channels. With the frequency of a desired channel being indicated by $f_0$, $$f_0 = 2f_1 - f_2 \tag{1}$$

when the following inequalities are met:

$$L_1 > k_1 \cdot L_0, \ L_2 > k_2 \cdot L_0 \tag{2}$$

where $k_1$, $k_2$ are constants, or alternatively when the following equation is met:

$$f_0 = 2f_1' - f_2' \tag{3}$$

and also the following inequalities are met:

$$L_1' > k_1 \cdot L_0, \ L_2' > k_2 > L_0 \tag{4}$$

where $k_1$, $k_2$ are constants, then a desired signal is subjected to jamming by intermodulation interference.

Figure 3:
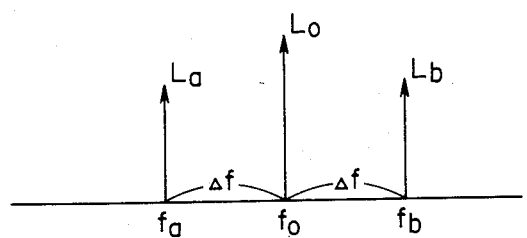
FIG. 3 is a diagram explanatory of signal jamming by adjacent broadcasting channels.

FIG. 3 shows the frequency $f_0$ of the signal from the desired channel, and frequencies $f_a$ $(=f_0-\Delta f)$, $f_b$ $(=f_0+\Delta f)$ of signals from adjacent jamming channels. When the following inequalities are met:

$$L_0 > k_3 \cdot L_a \tag{5}$$

$$L_0 > k_3 \cdot L_b \tag{6}$$

where $L_0$, $L_a$, $L_b$ are the levels of signals of the above frequencies, respectively, and k is a constant, or stated otherwise, when the level of the desired signal is higher than the product of the level of the signal from each adjacent jamming channel, then the desired signal suffers no jamming by the adjacent channels. When at least one of the inequalities (5) and (6) is not met, then the desired signal is subjected to jamming by at least one of the adjacent channels.

According to the present invention, (a) the levels of signals from adjacent jamming channels and other channels involved in intermodulation interference are detected by varying the frequency $f_0$ by $\Delta f (=n \cdot f_c, n=1, 2 \ldots,)$ while the signal (of the frequency $f_0$) from the desired channel is being received, (b) AGC is effected so that the inequalities will not be met, and (c) whether the inequalities (5) and (6) are met or not is determined. If both inequalities (5) and (6) are met, then an output signal from a tuner is applied through an IF filter of a wide band to an intermediate-frequency amplifier. If at least one of the inequalities (5) and (6) are not met, then the tuner output signal is applied via an IF filter of a narrow band to the intermediate-frequency amplifier. Thus, intermediate frequency bands are automatically switched.

FIGS. 4 through 7 are illustrative of a first FM radio receiver according to a first embodiment of the present invention.

Figure 4:
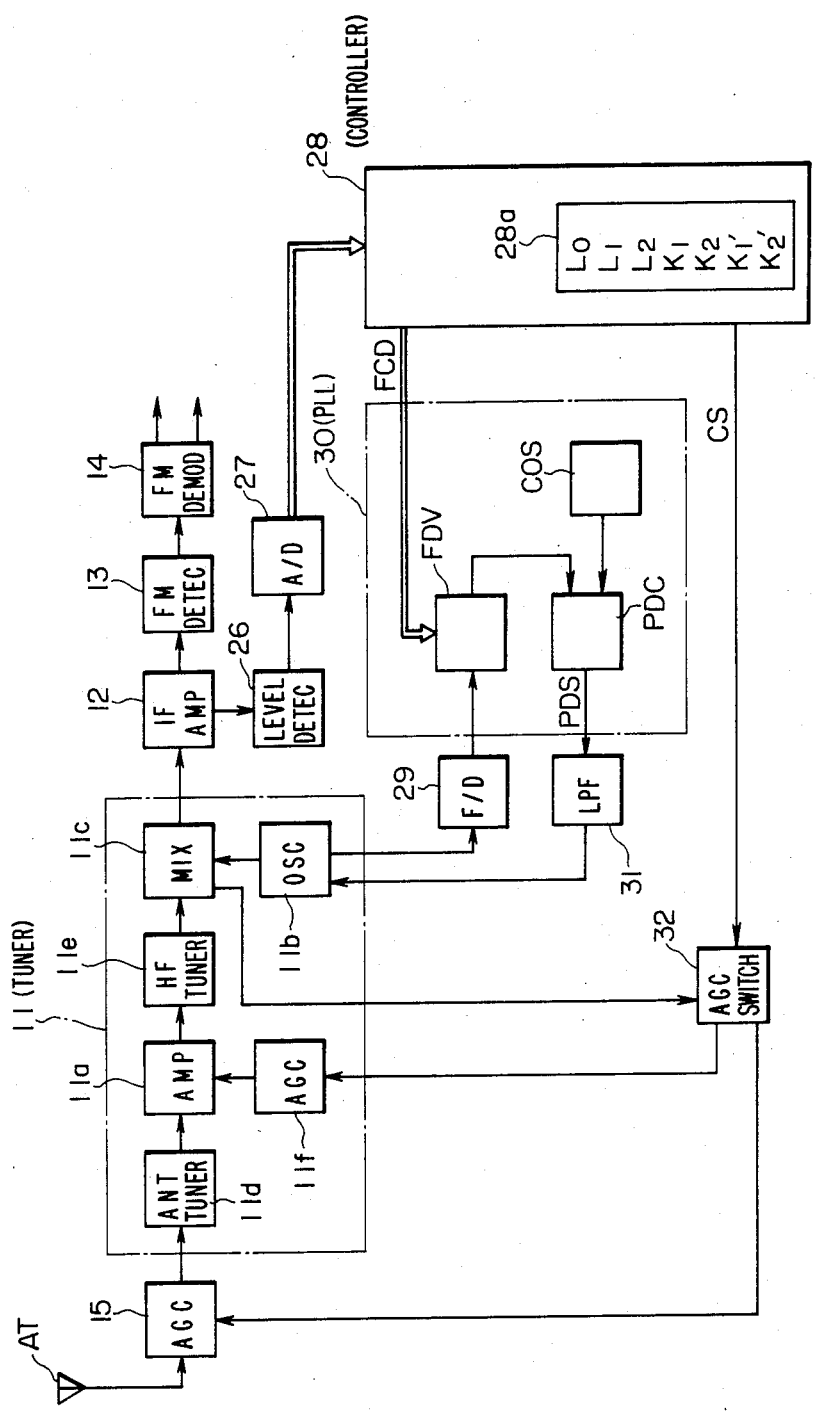
FIG. 4 is a block diagram of a first FM radio receiver according to a first embodiment of the present invention.

As shown in FIG. 4, the first FM radio receiver includes a tuner 11, an intermediate-frequency amplifier 12, an FM detector 13, a stereo demodulator circuit 14, a first AGC circuit 15 for effecting AGC of 20 dB, a level detector circuit 26, an analog-to-digital converter (AD converter) 27, a controller 28 comprising a microcomputer, a frequency-divider circuit 29, a phase-locked loop (PLL) circuit 30, a low-pass filter 31, and an AGC switching circuit 32. The tuner 11 has an antenna tuner circuit 11d, a high-frequency amplifier circuit 11a, a high-frequency tuner circuit 11e, a local oscillator 11b, a mixer 11c, and a second AGC circuit 11f (which effects AGC of 20 dB, for example) for controlling the gain of the high-frequency amplifier circuit 11a. The level detector circuit 26 extracts a portion of an intermediate-frequency signal from a front stage in the intermediate-frequency amplifier circuit 12 to detect the level of a received signal. The AD converter 27 converts the detected level into a digital value which is fed to the controller 28. The frequency-divider circuit 29 frequency-divides a frequency signal generated by the local oscillator 11b and applies the frequency-divided signal to the PLL circuit 30. The PLL circuit 30 is composed of a frequency-divider unit FDV for frequency-dividing the frequency signal generated by the frequency-divider circuit 29 based on frequency control data FCD from the controller 28, a crystal oscillator COS which oscillates at a fixed frequency, and a phase comparator unit PDC for comparing an output signal from the frequency-divider unit FDV and an output signal from the crystal oscillator COS to issue a phase-difference signal PDS. The phase-difference signal FDS from the phase comparator unit PDC is smoothed by the low-pass filter 31, which applies an output signal to a varactor diode in the local oscillator 11b to control the local oscillation frequency. The local oscillator 11b, the frequency-divider circuit 29, the PLL circuit 30, and the low-pass filter 31 jointly constitute a phase-locked loop for controlling the local oscillation frequency so as to be higher than the frequency of a broadcasting channel to be received by the intermediate frequency. More specifically, the controller 28 supplies frequency control data dependent on a frequency to be received to the PLL circuit 30, and the freuqency-divider unit FDV frequency-divides the frequency signal from the frequency-divider circuit 29 based on the frequency control data. The phase-locked loop controls the local oscillation frequency so that the frequency from the frequency-divider unit FDV will conincide with the frequency of the signal from the crystal oscillator COS. Therefore, the local oscillation frequency is finally higher than the frequency of the signal being received by the intermediate frequency.

Figure 5:
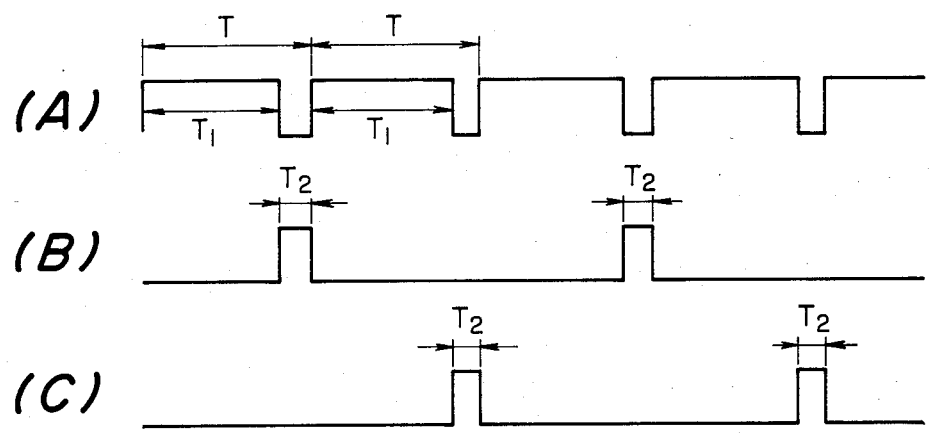
FIGS. 5A-C and 6A-C are first and second timing charts illustrative of detection of the levels of received frequencies other channels.
Figure 6:
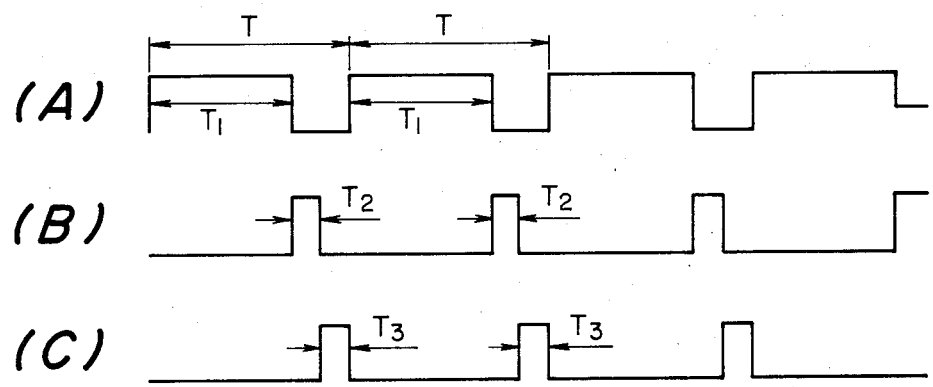

As shown in FIG. 5, the controller 28 issues frequency control data FCD to receive a desired frequency $f_0$ (FIG. 5(A)) for a time interval $T_1$ in each fixed period T, and also issues frequency control data FCD so that a frequency $f_1$ or $f_2$ from another channel will be received in short time intervals $T_2$ (FIGS. 5(B)

and (C)). In FIG. 5, the controller 28 produces the frequency control data FCD so that the first frequency $f_1$ from another channel will be received in the time intervals $T_2$ (FIG. 5(B)) in odd-numbered periods, and the second frequency $f_2$ from another channel will be received in the time intervals $T_2$ (FIG. 5(C)) in even-numbered periods. Therefore, the level detector circuit 26 is supplied with the level $L_0$ of a received signal having the desired freqeuncy $f_0$ during $T_1$, the level $L_1$ of a received signal having the freqeuncy $f_1$ during $T_2$ in the odd-numbered periods, and the level $L_2$ of a received signal having the frequency $f_2$ during $T_2$ in the even-numbered periods. The timing of detecting the levels $L_0$, $L_1$, $L_2$ is not limited to that shown in FIG. 5. As illustrated in FIG. 6, the desired frequency $f_0$ may be received in $T_1$ in each fixed period T, the first frequency $f_1$ from the other channel may be received in $T_2$ (FIG. 6(B)), and the second frequency $f_2$ from the other channel may be received in $T_3$ (FIG. 6(C)).

Figure 7:
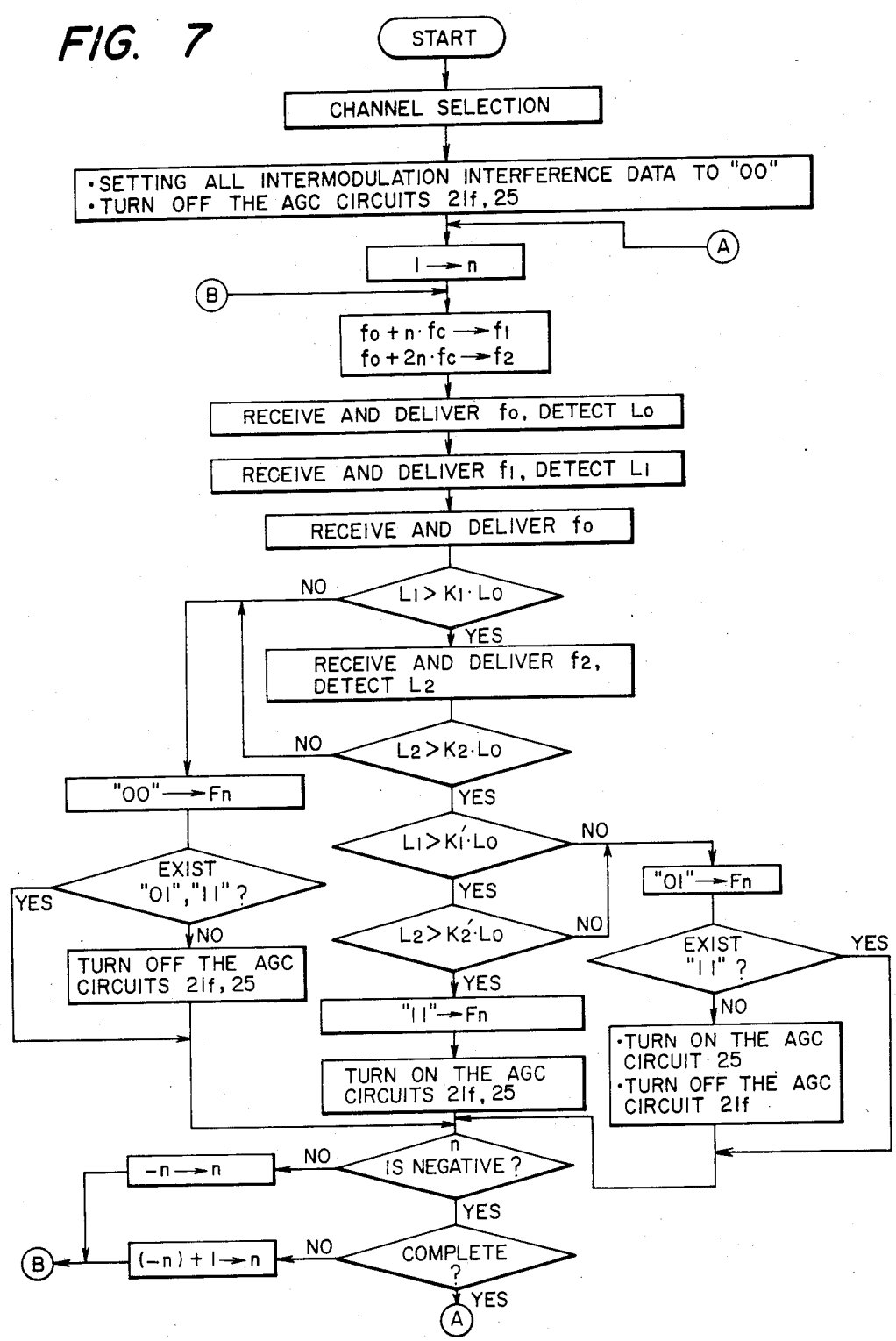
FIG. 7 is a flowchart of AGC operation for the first FM radio receiver.

Operation of the first FM radio receiver will be described with reference to the flowchart of FIG. 7.

(a) A channel selection switch (not shown) is depressed to select a channel, and channel selection information is given to the controller 28. The controller 28 is responsive to channel selection information for turning off the AGC circuits 11f, 15, and setting 1→n.

The controller 28 stores intermodulation interference data Fi for i=1, −1, 2, −2, ... indicative of interference with a desired frequency $f_0$ by first and second frequencies $f_1$, $f_2$ of other channels, which are given by formulas (7) and (8) below. The intermodulation interference data Fi is "00" when at least one of inequalities (9), (10), described later, is not met (i.e., when no intermodulation interference is present). When both inequalities (9), (10) are met and at least one of inequalities (11), (12) is not met (i.e., when intermodulation interference is produced but weak), the intermodulation data Fi is "01", and when all inequalities (9) through (12) are met (i.e., when intermodulation interference is produced and strong), the intermodulation interference data Fi is "11". At an initial stage, the intermodulation interference Fi (i=1, −1, 2, −2, ...) are all "00".

(b) Then, the controller 28 calculates the first and second frequencies $f_1$, $f_2$ of the other channels according to the following formulas:

$$f_0 + n \cdot f_c \rightarrow f_1 \qquad (7)$$

$$f_0 + 2n \cdot f_c \rightarrow f_2 \qquad (8)$$

AGC is hereinafter effected by detecting the level $L_0$ of the received desired freqeuncy $f_0$, and the levels $L_1$, $L_2$ of the received frequencies $f_1$, $f_2$ from the other channels. While these levels are being received, both AGC circuits 11f, 15 are turned off.

(c) Thereafter, the controller 28 applies frequency control data FCD to the PLL circuit 30 for receiving the desired frequency $f_0$ of the selected channel during an interval $T_1$ shown in FIG. 1, and stores in its memory 28a an output signal indicative of the level $L_0$ received from the level detector circuit 26 through the A/D converter 27.

(d) During an interval $T_2$ after the interval $T_1$, the controller 28 applies frequency control data FCD to the PLL circuit 30 for receiving the first frequency $f_1$ of the other channel, and stores in the memory 28a an output signal indicative of the level $L_1$ received from the level detector circuit 26 through the A/D converter 27.

(e) The controller 28 generates frequency control data FCD during an interval $T_1$ after the level $L_1$ has been detected to enable the tuner 11 to receive the desired frequency $f_0$. At the same time, the controller 28 determines whether the following inequality is met:

$$L_1 > k_1 \cdot L_0 \qquad (9)$$

(f) If the inequality (9) is not met, then any intermodulation interference is not produced by the frequencies $f_1$, $f_2$ given by the equations (7), (8), and the controller 28 sets the intermodulation interference data Fn to "00" and simultaneously checks whether other intermodulation interference data are all "00". If the other intermodulation interference data are all "00", then the controller 28 applies an AGC switching signal CS to the AGC switching circuit 32 to de-energize the AGC circuits 15, 11f. If at least one intermodulation interference data is "01" or "11", then the controller 28 does not change the state of the AGC circuits 15, 11f.

(g) Then, the controller 28 determines whether n is negative or not. If positive, then the controller 28 sets −n→n, and repeats the steps following the step (b). If n is negative, then the controller 28 jumps to a step (p).

(h) When the inequality (9) is met, it is possible that intermodulation interference may be produced by the frequencies $f_1$, $f_2$ given by the equations (7), (8), and the controller 28 executes the steps described below.

The controller 28 applies frequency control data FCD to the PLL circuit 30 for receiving the second frequency $f_2$ of the other channel during an interval $T_2$, and stores in the memory 28a an output signal indicative of the level $L_2$ from the level detector circuit 26 through the A/D convertor 27.

(i) Then, the controller 28 generates frequency control data FCD during an interval $T_1$ after the level $L_2$ has been detected, thereby enabling the tuner 11 to receive the desired frequency $f_0$, and at the same time determines whether the following inequality is met or not:

$$L_2 > k_2 \cdot L_0 \qquad (10)$$

(j) If the inequality (10) is not met, then any intermodulation interference is not produced by the frequencies $f_1$, $f_2$ given by the equations (7), (8), and the controller 28 sets the intermodulation interference data Fn to "00" and simultaneously checks whether other intermodulation interference data are all "00". If the other intermodulation interference data are all "00", then the controller 28 de-energizes the AGC circuits 15, 11f. If at least one intermodulation interference data is "01" or "11", then the controller 28 does not change the state of the AGC circuits 15, 11f, and jumps to the step (g).

(k) If the inequality (10) is met, intermodulation interference is produced, and the controller 28 effects the following AGC steps: The controller 28 determines whether the levels $L_0$, $L_1$, $L_2$ stored in the memory 28a meet the following relationships:

$$L_1 > k_1' \cdot L_0 \qquad (11)$$

$$L_2 > k_2' \cdot L_0 \qquad (11)$$

The constants $k_1'$, $k_2'$ and the constants $k_1$, $k_2$ in the inequalities meet the relationships: $k_1' > k_1$, $k_2' > k_2$.

(m) In case one of the inequalities (11), (12) is not met, the extent of intermodulation interference is not strong.

Therefore, the controller 28 sets the intermodulation interference data Fn to "01", and simultaneously checks whether there is "11" in other intermodulation interference data Fn. If there is no "11" in the other intermodulation interference data Fn, then the controller 28 applies an AGC switching signal CS to the AGC switching circuit 32 to energize the AGC circuit 15 and deenergize the AGC circuit 11f. If at least one of the intermodulation interference data is "11", the controller 28 does not change the state of the AGC circuits 15, 11f, and jumps to the step (g).

(n) In the event both inequalities (11), (12) are met, the extent of intermodulation interference is strong, and the controller 28 sets the intermodulation interference data Fn to "11". At the same time, the controller 28 applies an AGC switching signal CS to the AGC switching circuit 32 to energize both AGC circuits 15, 11f. Then, the controller 28 effects the step (g).

(p) If n is negative in the step (g), then the controller 28 determines whether the steps (b) through (n) have been completed for all frequencies involved in intermodulation interference.

(q) If the steps (b) through (n) have been completed for all frequencies, then the controller 28 sets 1→n and repeats the steps following the step (b). If the steps (b) through (n) have not yet been completed, then the controller 28 increments n by 1 according to the following equation:

$$(-n)+1 \rightarrow n$$

and repeats the steps following the step (b).

Since more noise and sound interruptions can be eliminated if the intervals $T_2$, $T_3$ are smaller, it is preferable to shorten these intervals. While the above embodiment has been described as being applied to an FM radio receiver, the invention is also applicable to an AM radio receiver. Furthermore, although the two AGC circuits are shown to provide three AGC modes, the invention is not limited to such an arrangement, but may be subjected to changes and modifications. While the AGC circuits 11f, 15 have been described as being energized together upon detection of the levels of received signals, the signal levels can be detected while one of the AGC circuits is energized, that is, while in a certain AGC mode.

Accoording to the first FM radio receiver of the present invention, the levels of first and second frequencies from other channels involved in intermodulation interference are detected in short time intervals in fixed periods while a desired frequency is being received, and an AGC mode is carried out in order to prevent signal jamming due to intermodulation interference based on the level of the received desired frequency and the received first and second frequencies of the other channels, and also to increase signal sensitivity, for thereby automatically setting an optimum signal receiving condition. The optimum signal receiving condition can automatically be set for example by introducing an AGC mode to lower the signal sensitivity for preventing jamming when there is a high level of intermodulation interference, and by effecting no AGC mode to increase the signal sensitivity when there is a low level of intermodulation interference. The radio receiver according to the first embodiment is suitable for use on a moving object such as an automobile since it will be placed in an appropriate AGC mode at all times if the state of intermodulation interference varies from time to time.

Figure 8:
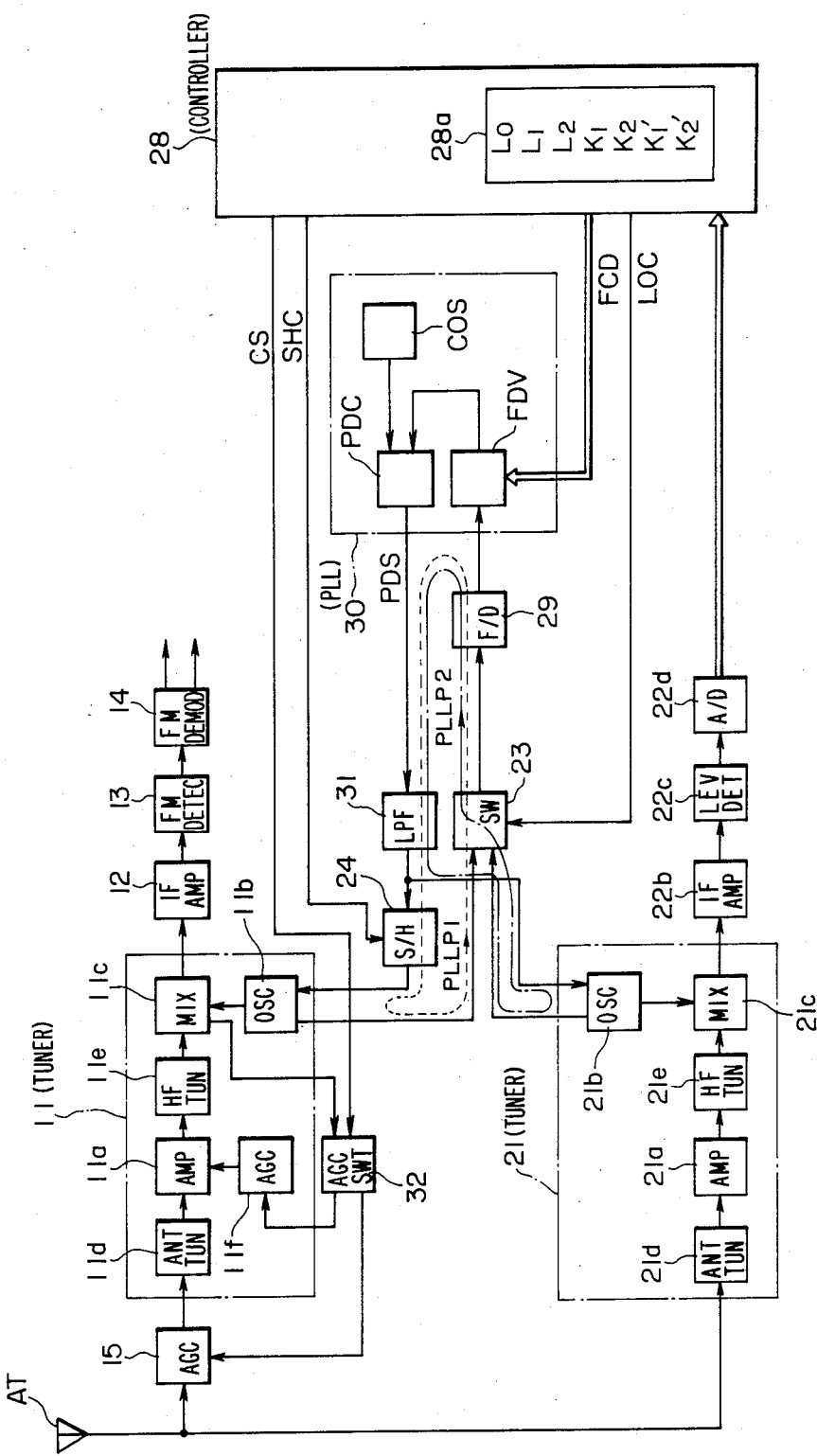
FIG. 8 is a block diagram of a second FM radio receiver according to a second embodiment of the present invention.
Figure 9:
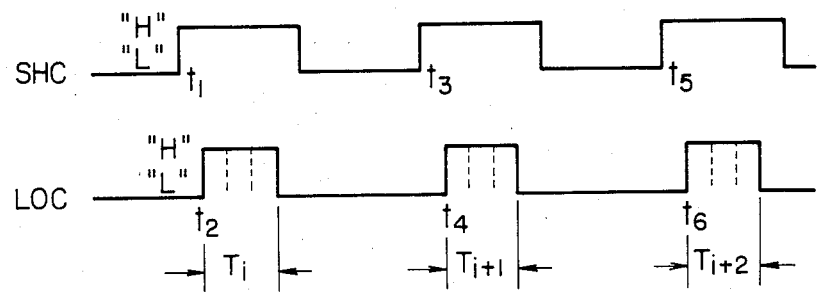
FIG. 9 is a timing chart illustrative of detection of the level of a received frequency from each channel.

FIGS. 8 through 10 are illustrative of a second FM radio receiver according to a second embodiment of the present invention. The FM radio receiver according to the second embodiment differs from the FM radio receiver of FIG. 4 in that the level detector circuit 26 and the A/D converter 27 are dispensed with, and the FM radio receiver of FIG. 8 additionally includes a second tuner 21, a second intermediate-frequency amplifier 22b, a level detector circuit 22c for extracting a portion of an intermediate-frequency signal from a front stage in the second intermediate-frequency amplifier circuit 22b to detect the levels of signals received by desired and other channels, an analog-to-digital converter (A/D converter) 22d for converting the received level into a digital value, a first phase-locked loop PLLP1 (indicated by the dotted line), a second phase-locked loop PLLP2 (indicated by the dot-and-dash line), the first and second phase-locked loops PLLP1, PLLP2 sharing the PLL circuit 30, and an AGC switching circuit 32. The second tuner 21 is substantially similar to the first tuner 11, and comprises a high-frequency amplifier circuit 21a for amplifying an input signal from an antenna AT, a mixer 21c, an antenna tuner circuit 21d, and a high-frequency tuner circuit 21e. The first phase-locked loop PLLP1 is composed of the local oscillator 11b of the first tuner 11, a switching circuit 23, the frequency-divider circuit 29, the PLL circuit 30, the low-pass filter 31, and a sample-and-hold circuit 24. The second phase-locked loop PLLP2 is composed of the local oscillator 21b of the second tuner 21, the switching circuit 23, the frequency-divider circuit 29, the PLL circuit 30, and the low-pass filter 31. The controller 28 issues a sample-and-hold command SHC at constant periods (shown in FIG. 9) to the sample-and-hold circuit 24, and also issues a local oscillator switching command LOC to the switching circuit 23. When the sample-and-hold command SHC is of a low level (at this time an output signal from the local oscillator 11b is applied to the PLL circuit 30 through the switchinig circuit 23 and the frequency-divider circuit 29), the controller 28 applies frequency control data FCD to the frequency-divider unit FDV in the PLL circuit 30 for enabling the first tuner 11 to receive and deliver the freuency $f_0$ in a desired channel. When the local oscillator switching command LOC is high in level (at this time an output signal from the local oscillator 21b is applied to the PLL circuit 30 through the switching circuit 23 and the frequency-divider circuit 29), the controller 28 applies frequency control data FCD for enabling the second tuner 21 to receive and deliver the frequency $f_0$ in the desired channel and the first and second frequencies $f_1$, $f_2$ in other channels, successively. More specifically, in an $i$ ($i=1, 2, \ldots$)th period Ti in which the local oscillator switching command LOC is of a high level, the controller 28 applies frequency control data FCD to the PLL circuit 30 for enabling the second tuner 21 to receive and deliver the desired frequency $f_0$. In a (i+1)th period Ti+1, the controller 28 applies frequency control data FCD to the PLL circuit 30 for enabling the second tuner 21 to receive and deliver the first frequency $f_1$ from the other channel. In a (i+2)th period Ti+2, the controller 28 applies frequency control data FCD to the PLL circuit 30 for enabling the second tuner 21 to receive and deliver the second frequency $f_2$ from the other channel. The controller 28 may apply frequency control data to the PLL circuit 30 such that each of the periods Ti, Ti+1, Ti+2 is divided into three periods, as shown in FIG. 9, and the frequency $f_0$ is received in the first period, the frequency $f_1$ is received in the second period, and the frequency $f_2$ is received in the third period.

While the sample-and-hold command SHC and the local oscillator switching command LOC are low in level, the controller 28 applies frequency control data FCD to the PLL circuit 30 for enabling the first tuner 11 to receive and issue the signal of the desired frequency $f_0$. Under this condition, an output signal from the local oscillator 11b is applied via the switching circuit 23 to the frequency-divider circuit 29, which frequency-divides a local oscillation frequency and applies the frequency-divided signal to the frequency-divider unit FDV. The frequency-divider unit FDV is based on the frequency control data DCD supplied from the controller 28 for frequency-dividing the output signal from the frequency-divider circuit 29 and applying the frequency-divided signal to the phase comparator unit PDC. The phase comparator unit PDC issues a phase difference signal PDS indicative of the phase difference between an output signal from the crystal oscillator COS and an output signal from the frequency-divider unit FDV. The low-pass filter 31 smooths the phase-difference signal PDS and applies the smoothed signal through the sample-and-hold circuit 24 to a varactor diode in the local oscillator 11b. As a result, the local oscillation frequency is finally rendered higher than the desired frequency $f_0$ by the intermediate frequency. The first tuner 11 receives and issues a signal in the desired channel, and a loudspeaker (not shown) generates sounds in the desired channel.

Under the foregoing condition, the controller 28 first issues a sample-and-hold command SHC of a high level at timing as shown in FIG. 9. As the sample-and-hold command SHC goes high, the sample-and-hold circuit 24 samples and holds an output from the low-pass filter 31. The held value is continuously applied to the local oscillator 11b until the sample-and-hold command SHC goes low, to enable the local oscillator 11b to oscillate at a frequency dependent on the held value. The period in which the sample-and-hold command SHC is high is short, and the held value can be regarded as constant. Therefore, the first tuner 11 receives and issues the desired frequency signal properly even during the period.

Then, the controller 28 applies a local oscillator switching command LOC of a high level to the switching circuit 23, and applies frequency control data FCD dependent on the desired frequency to the frequency-divider unit FDV in the PLL circuit 30. As a consequence, the local oscillator 21b in the second tuner 21 oscillates at a frequency higher than the desired frequency by the intermediate frequency under the control of the second phase-locked loop PLLP2. The level detector circuit 22c detects the level of the signal of the desired frequency and applies the detected level to the A/D converter 22d which converts the applied signal level into a digital value. The controller 28 reads the digital value as the received level $L_0$ of the desired frequency $f_0$ and stores the same into the memory 28a.

Thereafter, the controller 28 renders the local oscillator switching command LOC and the sample-and-hold command SHC low in level, and applies frequency control data FCD to the frequency-divider unit FDV in the PLL circuit 30 for enabling the first tuner 11 to receive the desired frequency $f_0$.

Subsequently, similar control is effected to read the signal level $L_1$ of the first frequency into the controller 28 in the next period Ti+1, and read the siganl level $L_2$ of the second frequency into the controller 28 in the period Ti+2, the levels being stored in the memory 28a. The controller 28 then determines whether the inequalities (2) are met using the levels $L_0$, $L_1$, $L_2$ and the constants $k_1$, $k_2$ in the inequalities (2), and controls the AGC circuits 11f, 15 for automatically establishing an optimum signal receiving condition.

AGC operation of the FM radio receiver shown in FIG. 8 will be described with reference to the flowchart of FIG. 10.

(a) A channel selection switch (not shown) is depressed to select a channel, and channel selection information is given to the controller 28. The controller 28 is responsive to channel selection information for turning off the AGC circuits 11f, 15, setting 1→n, and also setting all intermodulation interference data Fi (i=1, −1, 2, −2, ...) to "00".

(b) Then, the controller 28 calculates the first and second frequencies $f_1$, $f_2$ of the other channels according to the equations (7), (8).

(c) Thereafter, the controller 28 renders the local oscillator switching command LOC and the sample-and-hold command SHC low in level, and applies frequency control data FCD to the PLL circuit 30 for enabling the first tuner 11 to receive the desired frequency $f_0$ in a selected channel.

(d) After a predetermined time or at a time $t_1$, the controller 28 renders the sample-and-hold command SHC high in level to enable the sample-and-hold circuit 24 to sample and hold an output voltage from the PLL circuit 30. Until the sample-and-hold command goes low, the sample-and-hold circuit 24 applies the held value to the local oscillator 11b which oscillates on the basis of the applied value for enabling the first tuner 11 to receive the signal of the desired frequency.

(e) At a time $t_2$ after the sample-and-hold command has been issued, the controller 28 renders the local oscillator switching command LOC high in level to cause the switching circuit 23 to apply an output signal from the local oscillator 21b in the second tuner 21 to the PLL circuit 30. At the same time, the controller 28 applies prescribed frequency control data to the PLL circuit 30 for enabling the second tuner 21 to receive the desired frequency, and reads an output signal representative of the received level $L_0$ of the desired frequency $f_0$ from the level detector circuit 22c through the A/D converter 22d and stores the same into the memory 28a.

(f) After the level $L_0$ has been detected, the controller 28 successively renders the local oscillator switching command LOC and the sample-and-hold command SHC low, closes the first phase-locked loop PLLP1, and enables the first tuner 11 to receive the desired frequency.

(g) Upon elapse of prescribed times, or at times $t_3$, $t_4$, the controller 28 renders the sample-and-hold command SHC and the local oscillator switching command LOC high successively. The controller 28 applies prescribed frequency control data FCD to the PLL circuit 30 for enabling the second tuner 21 to receive the first frequency $f_1$, and reads an output signal indicative of the level $L_1$ from the level detector circuit 22c through the A/D converter 22d into the memory 28a.

(h) After the level $L_1$ has been detected, the controller 28 renders the local oscillator switching command LOC and the sample-and-hold command SHC low successively, and applies frequency control data dependent on the desired frequency to the PLL circuit 30 for causing the first tuner 11 to receive the desired frequency. The controller 28 at the same time determines whether the inequality (9) is met.

(i) If the inequality (9) is not met, then any intermodulation interference is not produced by the frequencies $f_1$, $f_2$ given by the equations (7), (8), and the controller 28 sets the intermodulation interference data Fn to "00" and simultaneously checks whether other intermodulation interference data are all "00". If the other intermodulation interference data are all "00", then the controller 28 applies an AGC switching signal CS to the AGC switching circuit 32 to de-energize the AGC circuits 11f, 15. If at least one intermodulation interference data is "01" or "11", then the controller 28 does not change the state of the AGC circuits 15, 11f.

(j) Then, the controller 28 determines whether n is negative or not. If positive, then the controller 28 sets $-n \to n$, and repeats the steps following the step (b). If n is negative, then the controller 28 jumps to a step (s).

(k) When the inequality (9) is met, it is possible that intermodulation interference may be produced by the frequencies $f_1$, $f_2$ given by the equations (7), (8), and the controller 28 executes the steps described below. The controller 28 renders the sample-and-hold command SHC and the local oscillator switching command LOC high successively at times $t_5$, $t_6$. The controller 28 applies prescribed frequency control data FCD to the PLL circuit 30 for enabling the second tuner to receive the second frequency $f_2$, and reads an output signal indicative of the level $L_2$ from the level detector circuit 22c via the A/D converter 22d into the memory 28a.

(m) After the level $L_2$ has been detected, the controller 28 renders the local oscillator switching command LOC and the sample-and-hold command SHC low successively, and applies frequency control data dependent on the desired frequency $f_0$ to the PLL circuit 30 for causing the first tuner to receive the desired frequency. At the same time, the controller 28 determines whether the inequality (10) is met.

(i) If the inequality (10) is not met, then any intermodulation interference is not produced by the frequencies $f_1$, $f_2$ given by the equations (7), (8), and the controller 28 sets the intermodulation interference data Fn to "00" and simultaneously checks whether other intermodulation interference data are all "00". If the other intermodulation interference data are all "00", then the controller 28 de-energizes the AGC circuits 11f, 15. If at least one intermodulation interference data is "01" or "11", then the controller 28 does not change the state of the AGC circuits 15, 11f, and the controller 28 jumps to the step (j).

(p) If the inequality (10) is met, then intermodulation interference is produced, and the controller 28 effects the following AGC process: The controller 28 determines whether the levels $L_0$, $L_1$, $L_2$ stored in the memory 28a meet the inequalities (11), (12).

(q) In case one of the inequalities (11), (12) is not met, the extent of intermodulation interference is not strong. Therefore, the controller 28 sets the intermodulation interference data Fn to "01", and simultaneously checks whether there is "11" in other intermodulation interference data Fn. If there is no "11" in the other intermodulation interference data Fn, then the controller 28 applies an AGC switching signal CS to the AGC switching circuit 32 to energize the AGC circuit 15 and de-energize the AGC circuit 11f. If at least one of the intermodulation interference data is "11", the controller 28 does not change the state of the AGC circuits 15, 11f, and jumps to the step (j).

(r) In the event both inequalities (11), (12) are met, the extent of intermodulation interference is strong, and the controller 28 sets the intermodulation interference data Fn to "11". At the same time, the controller 28 applies an AGC switching signal CS to the AGC switching circuit 32 to energize both AGC circuits 11f, 15. Then, the controller 28 effects the step (j).

(s) If n is negative in the step (j), then the controller 28 determines whether the steps (b) through (r) have been completed for all frequencies involved in intermodulation interference.

(t) If the steps (b) through (r) have been completed for all frequencies, then the controller 28 sets $1 \to n$ and repeats the steps following the step (b). If the steps (b) through (r) have not yet been completed, then the controller 28 increments n by 1 according to the following equation:

$$(-n) + 1 \to n$$

and repeats the steps following the step (b).

As described above, the second FM radio receiver has first and second tuners, first and second phase-locked loops sharing a single PLL circuit, and a sample-and-hold circuit. In operation, the levels of signals received in channels are detected by the second tuner, and an output voltage from the PLL circuit is held in the sample-and-hold circuit. When the levels in the channels are detected on the basis of outputs from the second tuner, the value held by the sample-and-hold circuit is applied to the first tuner to enable the latter to receive the desired frequency. Therefore, sounds reproduced in the desired channel do not suffer from noise or is not interrupted when the levels of the signals in the channels are detected.

Figure 12:
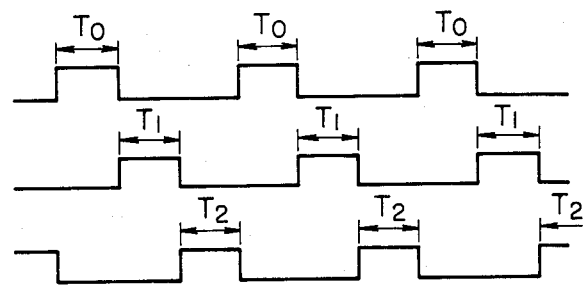
FIG. 12 is a timing chart illustrative of detection of the level of a received frequency from each channel.
Figure 11:
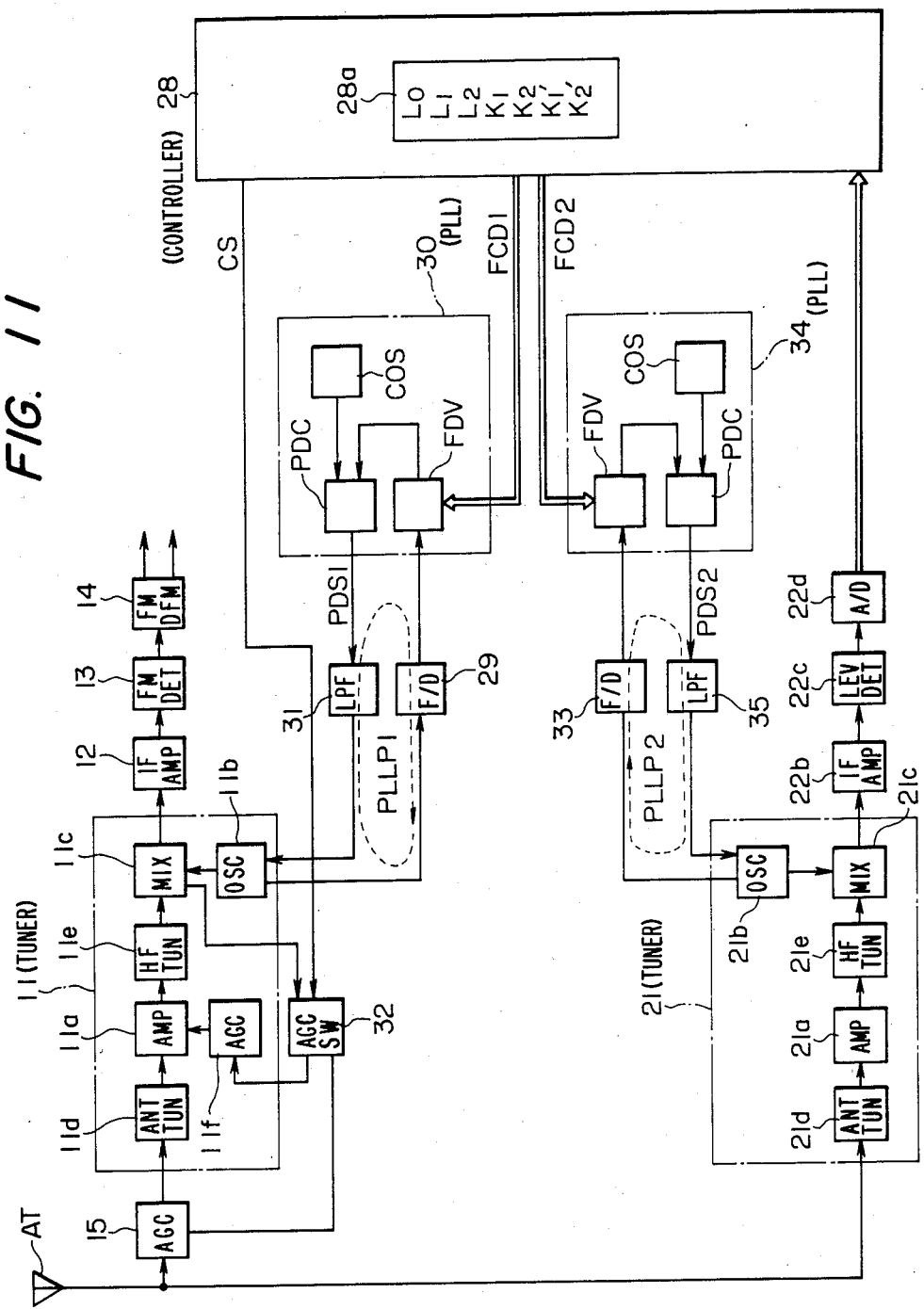
FIG. 11 is a block diagram of a third FM radio receiver according to a third embodiment of the present invention.
Figure 13:
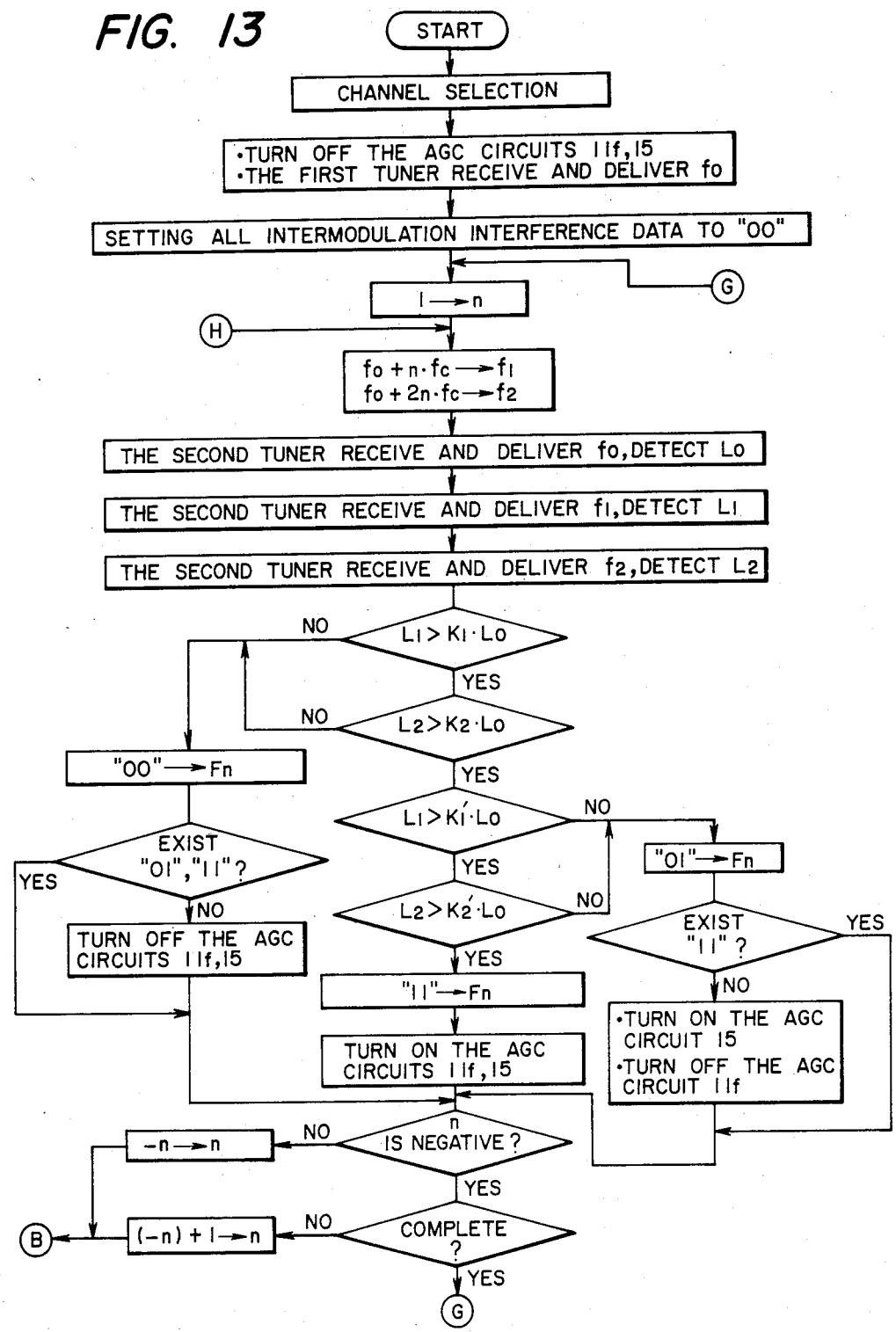
FIG. 13 is a flowchart of AGC operation for the third FM radio receiver.

FIGS. 11 through 13 show a third FM radio receiver according to a third embodiment of the present invention. The receiver includes a first phased-locked loop PLLP1 composed of a local oscillator 11b, a frequency-divider circuit 29, a PLL circuit 30, and a low-pass filter 31, a second phased-locked loop PLLP2 composed of a local oscillator 21b, a frequency-divider circuit 33, a PLL circuit 34, and a low-pass filter 35. The PLL circuits 30, 34 are of the same construction as that shown in FIG. 8. Each of the PLL circuits 30, 34 is composed of a frequency-divider unit FDV for frequency-dividing a frequency signal issued from the frequency-divider circuit 29 or 33 based on first or second frequency control data FCD1, FCD2 generated from a controller 28, a crystal oscillator COS for oscillating at a constant frequency, and a phase comparator unit PDC for comparing the phases of an output signal from the frequency-divider unit FDV and an output signal from the crystal oscillator COS to issue a phase difference signal PDS1 or PDS2. The controller 28 issues the first frequency control data FCD1 to the frequency-divider unit FDV in the PLL circuit 30 for enabling the first tuner 11 to receive and deliver the frequency $f_0$ in a desired channel. The controller 28 also issues the second frequency control data FCD2 to the PLL circuit 34 for enabling the second tuner 21 to receive and deliver the frequency f in the desired channel and first and second frequencies $f_1$, $f_2$ in other channels which are involved in intermodulation interference at timing as shown in FIG. 12. More specifically, the controller 28 issues the second frequency control data FCD2 to the PLL circuit 34 for enabling the second tuner 21 to receive and deliver the desired frequency $f_0$ in periods $T_0$ illustrated in FIG. 12, issues the second frequency control data FCD2 to the PLL circuit 34 for enabling the second tuner 21 to receive and deliver the first frequency $f_1$ in periods $T_1$, and issues the second frequency control data FCD2 to the PLL circuit 34 for enabling the second tuner 21 to receive and deliver the second frequency $f_2$ in periods $T_2$.

When the first frequency control data FCD1 is applied by the controller 28 to the PLL circuit 30, the local oscillator 11b oscillates at a constant oscillation frequency which than the desired frequency $f_0$ by the intermediate frequency. The first tuner 11 then receives and issues a signal of the desired frequency $f_0$ from the desired channel to enable a loudspeaker (not shown) to generate sounds in the desired channel. Stated otherwise, the local oscillation frequency of the local oscillator 11b is rendered higher, by the intermediate frequency, than the desired frequency $f_0$ specified by the first frequency control data FCD1 under the control of the first phase-locked loop FCD1, and sounds from the desired channel are reproduced by the loudspeaker.

Under the above condition, the second frequency control data FCD2 is issued by the controller 28 to the PLL circuit 34 for enalbing the second tuner 21 to receive and issue the signal of the desired frequency $f_0$ at the time $T_0$ shown in FIG. 12. As a result, the local oscillator 21b in the second tuner 21 oscillates at a frequency higher than the desired frequency $f_0$ by the intermediate frequency under the control of the second phase-locked loop PLLP2, and the level detector circuit 22c detects a signal level of the desired frequency $f_0$ and applies the same to the A/C converter 22d. The A/D converter 22d converts the signal level into a digital value which is read as a level $L_0$ of the desired frequency $f_0$ by the controller 28 into the memory 28a therein.

Then, the controller 28 issues the second frequency control data FCD2 at a time $T_1$ in FIG. 12 to enable the second tuner 12 to receiver and issue a signal fo the first frequency $f_1$ involved in intermodulation interference. The local oscillator 21b in the second tuner 21 is then caused under the control of the second phase-locked loop PLLP2 to oscillate at a fixed frequency that is higher than $f_1$ by the intermediate frequency, and the level detector circuit 22c detects a signal level of the first frequency $f_1$. The controller 28 stores a signal level $L_1$ of the first frequency $f_1$ into the memory 28a.

Thereafter, the controller applies the second frequency control data FCD2 to the PLL circuit 34 in order to enable the second tuner 21 to receive and issue a signal of the second frequency $f_2$ involved in intermodulation interference at a time $T_2$ illustrated in FIG. 12. The local oscillator 21b in the second tuner 21 is then caused under the control of the second phase-locked loop PLLP2 to oscillate at a fixed frequency that is higher than $f_2$ by the intermediate frequency, and the level detector circuit 22c detects a signal level of the second frequency $f_2$. The controller 28 stores a signal level $L_2$ of the second frequency $f_2$ into the memory 28a.

The controller 28 thereafter reads next $L_0$, $L_1$, $L_2$ at times $T_0$, $T_1$, $T_2$, respectively, and then determines whether the inequalities (2) are met using the levels $L_0$, $L_1$, $L_2$ stored in the memory 28a and the constants $k_1$, $k_2$ in the inequalities (2) which are stored in advance in the memory 28a, and controls the AGC circuits 11f, 15 for automatically establishing an optimum signal receiving condition.

AGC operation of the FM radio receiver shown in FIG. 11 will be described with reference to the flowchart of FIG. 13.

(a) A channel selection switch (not shown) is depressed to select a channel, and channel selection information is given to the controller 28.

(b) The controller 28 is responsive to channel selection information for turning off the AGC circuits 11f, 15, and applying prescribed first frequency control data FCD1 to the PLL circuit 30 for enabling the first tuner 11 to receive a signal of a desired frequency $f_0$ in the selected channel. The first tuner 11 then continues to receive the desired frequency $f_0$.

(c) Then, the controller 28 sets 1→n, and initially sets all intermodulation interference data Fi (i=1, −1, 2, −2, ...) to "00".

(d) Thereafter, the controller 28 calculates the first and second frequencies $f_1$, $f_2$ of the other channels according to the equations (7), (8).

(e) After the first and second frequencies $f_1$, $f_2$ have been calculated, the controller 28 applies the second frequency control data FCD2 to the PLL circuit 34 for enabling the second tuner 21 to receive the signal of the desired frequency $f_0$ of the selected channel during the period $T_0$ of FIG. 12, and reads an output signal indicative of a level $L_0$ of the received signal issued from the level detector circuit 22c through the A/D converter 22d at this time into the memory 28a.

(f) Then, during a time $T_1$ upon elapse of the period $T_0$, the controller 28 applies the second frequency control data FCD2 to the PLL circuit 34 for enabling the second tuner 21 to receive a first frequency $f_1$ of another channel, and reads an output signal indicative of a level $L_1$ of the received signal issued from the level detector circuit 22c through the A/D converter 22d at this time into the memory 28a.

(g) During a time $T_2$ after the level $L_1$ has been detected, the controller 28 applies the second frequency control data FCD2 to the PLL circuit 34 for enabling the second tuner 21 to receive a second frequency $f_2$ of another channel, and reads an output signal indicative of a level $L_2$ of the received signal issued from the level detector circuit 22c through the A/D converter 22d at this time into the memory 28a.

(h) When the level $L_2$ is detected, the controller 28 determines whether the inequality (9) is met or not.

(i) If the inequality (9) is not met, then any intermodulation interference is not produced by the frequencies $f_1$, $f_2$ given by the equations (7), (8), and the controller 28 sets the intermodulation interference data Fn to "00" and simultaneously checks whether other intermodulation interference data are all "00". If the other intermodulation interference data are all "00", then the controller 28 applies an AGC switching signal CS to the AGC switching circuit 32 to de-energize the AGC circuits 11f, 15. If at least one intermodulation interference data is "01" or "11", then the controller 28 does not change the state of the AGC circuits 15, 11f, and jumps to a step (q).

(j) If the inequality (9) is met, then it is possible that intermodulation interference may be produced by the frequencies $f_1$, $f_2$ given by the equations (7), (8), and the controller 28 executes the steps described below. The controller 28 determines whether the inequality (10) is met.

(k) If the inequality (10) is not met, then any intermodulation interference is not produced by the frequencies $f_1$, $f_2$ given by the equations (7), (8), and the controller 28 sets the intermodulation interference data Fn to "00" and simultaneously checks whether other intermodulation interference data are all "00". If the other intermodulation interference data are all "00", then the controller 28 de-energizes the AGC circuits 11$f$, 15. If at least one intermodulation interference data is "01" or "11", then the controller 28 does not change the state of the AGC circuits 15, 11$f$, and the controller 28 jumps to the step (q).

(m) If the inequality (10) is met, then intermodulation interference is produced, and the controller 28 effects the following AGC process: The controller 28 determines whether the levels $L_0$, $L_1$, $L_2$ stored in the memory 28$a$ meet the inequalities (11), (12).

(n) In case one of the inequalities (11), (12) is not met, the extent of intermodulation interference is not strong. Therefore, the controller 28 sets the intermodulation interference data Fn to "01", and simultaneously checks whether there is "11" in other intermodulation interference data Fn. If there is no "11" in the other intermodulation interference data Fn, then the controller 28 applies an AGC switching signal CS to the AGC switching circuit 32 to energize the AGC circuit 15 and de-energize the AGC circuit 11$f$. If at least one of the intermodulation interference data is "11", the controller 28 does not change the state of the AGC circuits 15, 11$f$ and jumps to the step (q).

(p) In the event both inequalities (11), (12) are met, the extent of intermodulation interference is strong, and the controller 28 sets the intermodulation interference data Fn to "11". At the same time, the controller 28 applies an AGC switching signal CS to the AGC switching circuit 32 to energize both AGC circuits 11$f$, 15. Then, the controller 28 effects the step (q).

(q) The controller 28 determines whether n is negative or not. If positive, then the contoller 28 sets $-n \rightarrow n$, and repeats the steps following the step (d).

(r) If n is negative in the step (q), then the controller 28 determines whether the steps following the step (d) have been completed for all frequencies involved in intermodulation interference.

(s) If the steps following the step (d) have been completed for all frequencies, then the controller 28 sets $1 \rightarrow n$, and repeats the steps following the step (d). If not completed, then the controller 28 increments n by 1 according to the following equation:

$$(-n)+1 \rightarrow n$$

and repeats the steps following the step (b).

In the above description, only one controller 28 is employed. However, two controllers may be provided, and the first controller may be programmed to execute a PLL synthesizing process for enabling the first tuner to receive the frequency singal in the selected channel, and the second controller may be programmed to detect the levels of the frequency signal in the desired channel and the frequency signals in other channels involved in intermodulation interference and also to effect AGC operation.

As described above, the third FM radio receiver includes a first tuner for receiving and issuing a desired frequency and a first phased-locked loop, and additionally a second tuner for detecting the levels of signals received in channels and a second phase-locked loop. In operation, the levels of signals received in the channels are detected through an output signal from the second tuner, and AGC is effected on the basis of the levels of the received signals. Therefore, the signal levels in the other channels can be detected without adversely affecting the reception of the desired frequency by the first tuner. As a consequence, sounds reproduced in the desired channel will not suffer from noise or not be interrupted by any operation to detect the levels of the received signals.

Figure 15:
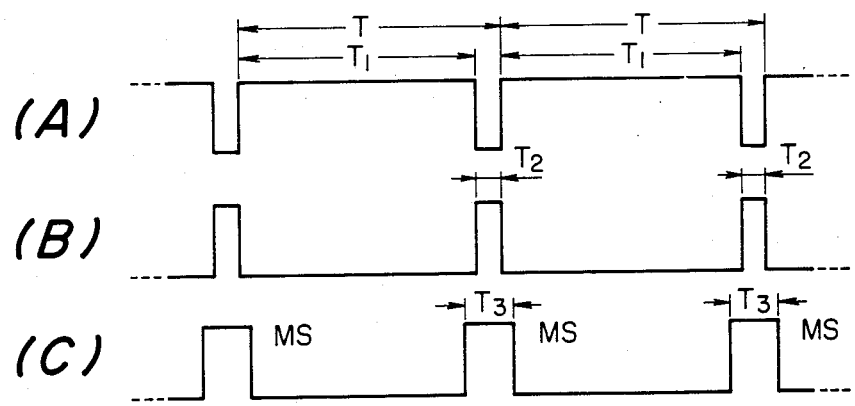
FIGS. 15A-C are timing charts illustrative of detection of the levels of received desired and jamming signals.
Figure 14:
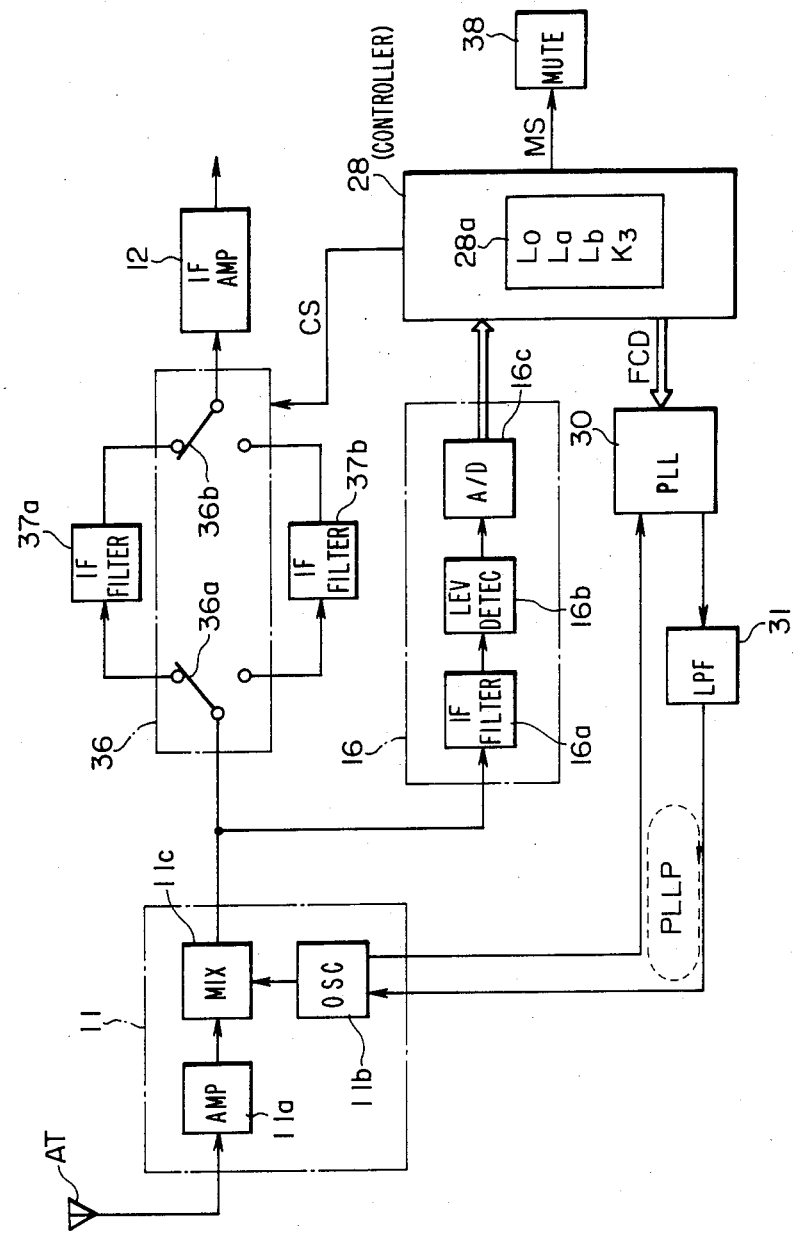
FIG. 14 is a block diagram of a fourth FM radio receiver according to a fourth embodiment of the present invention.
Figure 16:
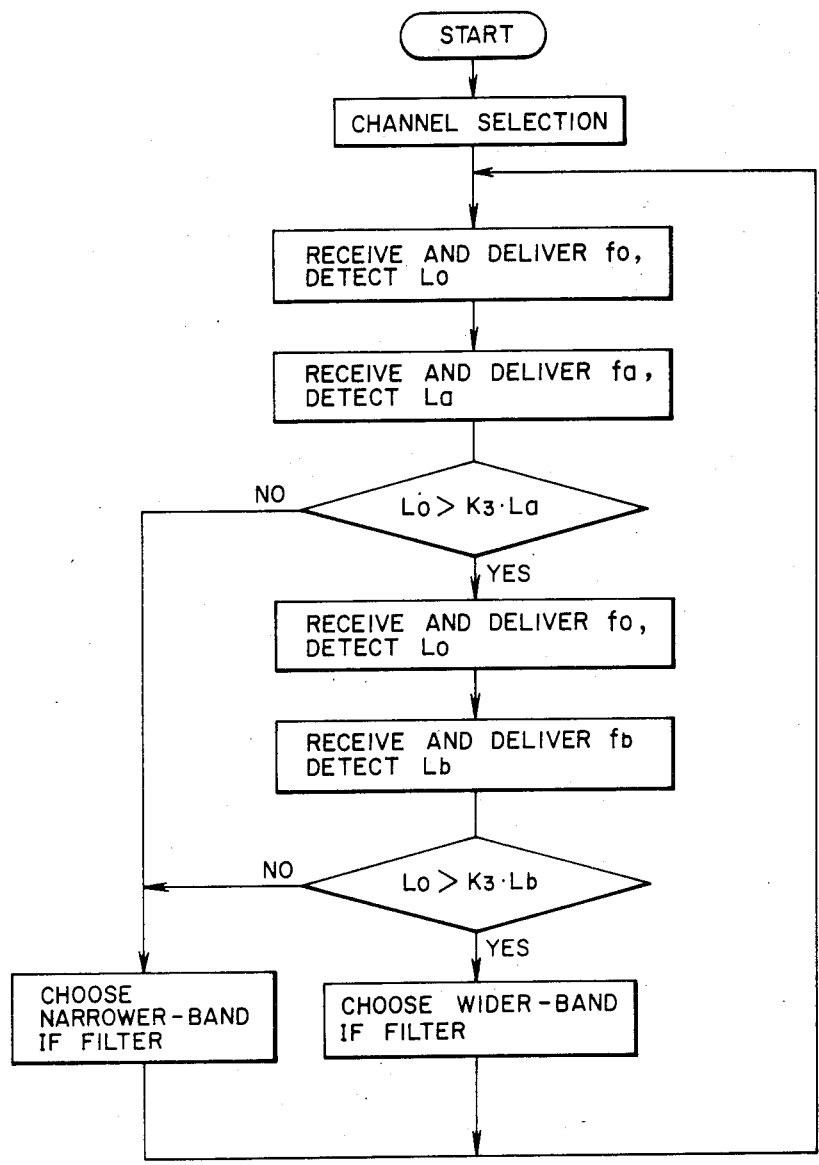
FIG. 16 is a flowchart of intermediate-frequency-band switching operation for the fourth FM radio receiver.

FIGS. 14 through 16 illustrate a fourth radio receiver according to a fourth embodiment of the present invention.

As shown in FIG. 14, the radio receiver comprises a tuner 11, an intermediate-frequency amplifier 12, IF filters 37$a$, 37$b$ disposed between the tuner 11 and the intermediate-frequency amplifier 12, the IF filter 37$a$ having a wider band and the IF filter 37$b$ having a narrower band, a switching circuit 36 having switches 36$a$, 36$b$ for applying an output signal from the tuner 11 through one of the IF filters to the intermediate-frequency amplifier 12, a level detector circuit 16, a controller 28 composed of a microcomputer, a PLL circuit 30, a low-pass filter 31, an audio muting circuit 38, and a phased-locked loop PLLP. The tuner 11 is composed of a high-frequency amplifier circuit 11$a$ for amplifying an input signal from an antenna AT, a local oscillator 11$b$, and a mixer 11$c$. The level detector circuit 16 comprises an intermediate-frequency filter 16$a$ of a narrow band, a detector 16$b$, and an A/C converter 16$c$. The phase-locked loop is constituted of the local oscillator 11$b$, the PLL circuit 30, and the low-pass filter 31 for controlling a local oscillation frequency to be higher, by an intermediate frequency, than a frequency in a channel to be received. More specifically, the phase-locked loop controls the local oscillator 11$b$ to oscillate at a frequency specified by frequency control data FCD fed from the controller 28 to the PLL circuit 30.

The controller 28 applies predetermined frequency control data FCD to the PLL circuit 30 for enabling the tuner 11 to receive a desired signal of a frequency $f_0$ during a period $T_1$ in a fixed period T (FIG. 5(A)). During a period $T_2$, the controller 28 actuates the switches 36$a$, 36$b$ to disconnect the intermediate-frequency amplifier 12 from the tuner 11, and applies predetermined frequency control data FCD to the PLL circuit 30 for enabling the tuner 11 to receive a jamming signal of a frequency $f_a$ or $f_b$. Since the desired signal is not issued from the tuner 11 during the period $T_2$, a sound interruption would result if the period $T_2$ were too long. Therefore, it is preferable to reduce the period $T_2$ to the extent that no sound interruption will be appreciable. To prevent any abnormal sounds from being produced when switching between received frequencies, a muting signal MS is applied by the audio muting signal 38 in each period $T_3$ (FIG. 15(C)) which overlaps the period $T_2$.

The level detector circuit 16 detects a level $L_0$ of the desired signal having the frequency $f_0$ during the period $T_1$, and detects a level $L_a$ or $L_b$ of the jamming signal having the frequency $f_a$ or $f_b$ during the period $T_2$. The digital values of the levels are read by the controller 28 into a memory 28$a$ therein.

Operation of the radio receiver shown in FIG. 14 will be described with reference to the flowchart of FIG. 16.

(a) A channel selection switch (not shown) is depressed to select a channel, and channel selection information is given to the controller 28.

(b) The controller 28 is responsive to channel selection information for applying prescribed frequency control data FCD to the PLL circuit 30 to enable the tuner 11 to receive and issue a desired signal during a period $T_1$ (FIG. 15). The controller 28 stores in its memory 28a an output signal indicative of a level $L_0$ of the received signal from the level detector 16. The controller 28 stores in the memory thereof the relationship between channel selection switches and frequency control data, and applies the frequency control data dependent on the actuated channel selection switch to the PLL circuit 30.

(c) Then, during $T_2$ upon elapse of the period $T_1$, the controller 28 applies frequency control data FCD dependent on a first adjacent jamming channel to the PLL circuit 30 for enabling the tuner 11 to receive and issue a jamming signal (having a frequency $f_a$) of the first adjacent jamming channel. The controller 28 also reads an output signal having a level $L_a$ of the received signal from the level detector circuit 16 into the memory 28a.

(d) After the controller 28 has detected the level $L_a$, it determines whether the inequality (5) is met or not. If the inequality (5) is not met, then intermodulation interference is produced by the first adjacent jamming channel. The controller 28 applies a switching signal CS to the switching circuit 36 to select the IF filter 37b of narrower band to repeat the steps following the step (b). An output terminal of the tuner 11 is now connected to an input terminal of the intermediate-frequency amplifier 12 through the narrower-band IF filter 37b.

If the inequality (5) is met, then no intermodulation interference is caused by the first adjacent jamming channel, and the controller 28 checks whether intermodulation interference is caused by a second adjacent jamming channel, by effecting the following steps:

(e) During $T_1$ in a next period T, the controller 28 applies prescribed frequency control data FCD to the PLL circuit 30 for enabling the tuner 11 to receive and deliver the desired signal, and reads an output signal indicative of the level $L_0$ generated from the level detector circuit 16 at this time into the memory 28a.

(f) Then, during $T_2$ upon elapse of the period $T_1$, the controller 28 applies frequency control data FCD dependent on a second adjacent jamming channel to the PLL circuit 30 for enabling the tuner 11 to receive and issue a jamming signal (having a frequency $f_b$) of the second adjacent jamming channel. The controller 28 also reads an output signal having a level $L_b$ of the received signal from the level detector circuit 16 into the memory 28a.

(g) After the controller 28 has detected the level $L_b$, it determines whether the inequality (6) is met or not. If the inequality (6) is not met, then intermodulation interference is produced by the second adjacent jamming channel. The controller 28 applies a switching signal CS to the switching circuit 36 to select the IF filter 37b of narrower band to repeat the steps following the step (b).

(h) If the inequality (5) is met, then no intermodulation interference is caused by the second adjacent jamming channel, and the controller 28 applies a switching signal CS to the switching circuit 36 to select the IF filter 37a of wider band. The controller 28 thereafter repeats the steps following the step (b). By effecting the step (h), the output terminal of the tuner 11 is connected to the input terminal of the intermediate-frequency amplifier 12 through the narrower-band IF filter 37a.

Although two IF filters having different frequency bands have been described above, the present invention is not limited to two IF filters, but three or more IF filters may be provided. With such an alternative, a plurality of inequalities are provided which include different constants $k_3$ as in the inequalities (5), (6), and a desired IF filter can be selected dependent on whether such a plurality of inequalities are met or not.

While in the above embodiment only one jamming signal is detected during the period $T_5$ (FIG. 15), two jamming signals may be detected during the period $T_5$.

Although the switching circuit 36 has not been described in detail, each switch 36a, 36b comprises an electronic switch such as a swtiching transistor or a diode. Although the switching circuit 36 is shown in FIG. 14 as being composed of the two switches 36a, 36b, the switch 36a may be dispensed with, and the input terminals of the IF filters 37a, 37b may be coupled to the output terminal of the tuner 11.

The fourth radio receiver of the invention includes a controller for controlling the tuning frequency of a tuner, and a level detector circuit. The controller enables the tuner to receive a desired signal and jamming signals from first and second adjacent jamming channels, determines through comparison the levels of the desired and jamming signals as detected by the level detector circuit, and selects a desired IF filter based on the result of determination. Therefore, the radio receiver is simple in arrangement as it requires no detector circuit for detecting the level of a jamming signal for each adjacent channel and no circuit for level determination for each adjacent channel. Since the levels of the desired and jamming signals can accurately be compared, a proper IF filter can be selected. The arrangement of the radio receiver will not be rendered more complex even if more IF filters are employed.

Figure 17:
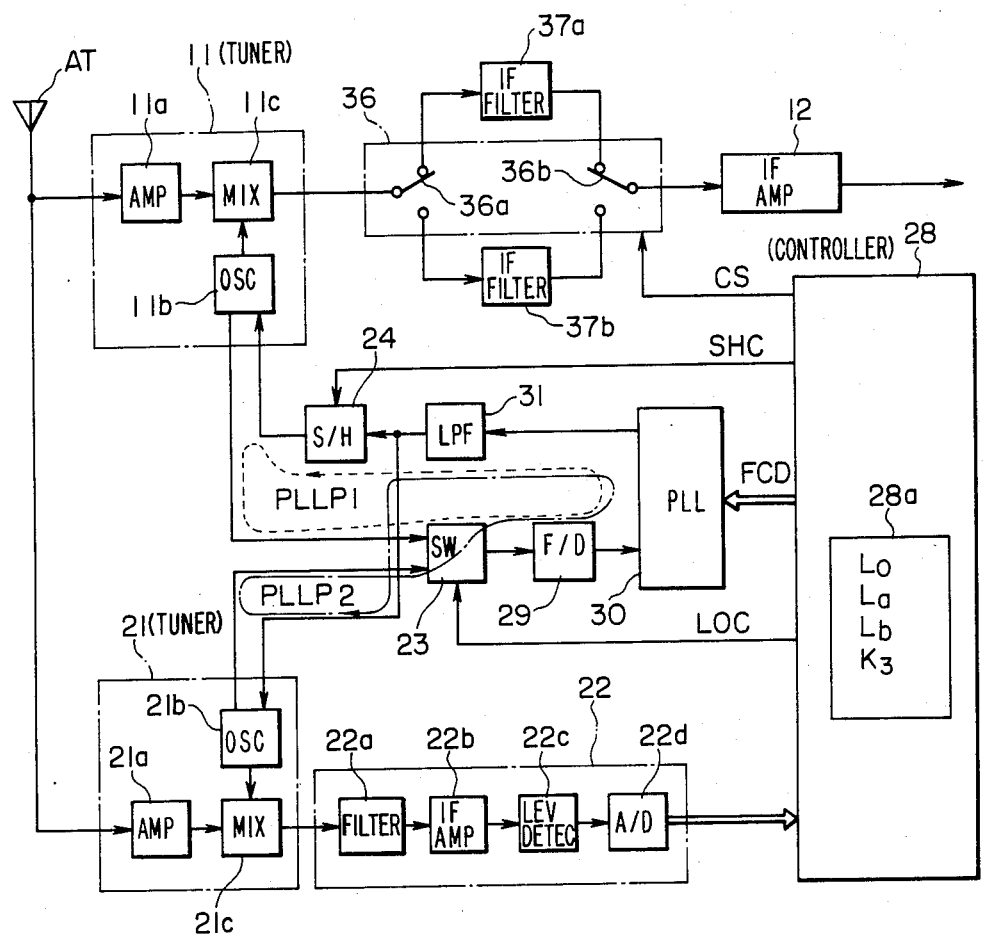
FIG. 17 is a block diagram of a fifth FM radio receiver according to a fifth embodiment of the present invention.
Figure 18:
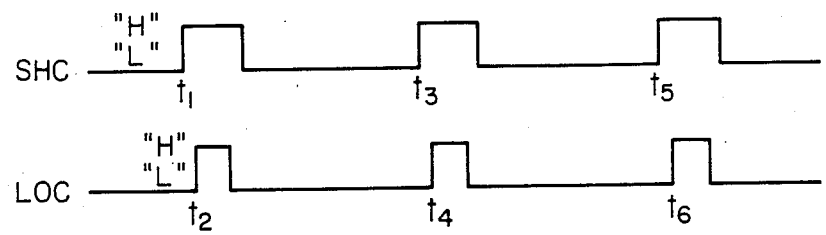
FIG. 18 is a timing chart illustrative of a sample-and-hold command and a local oscillator switching command.
Figure 19:
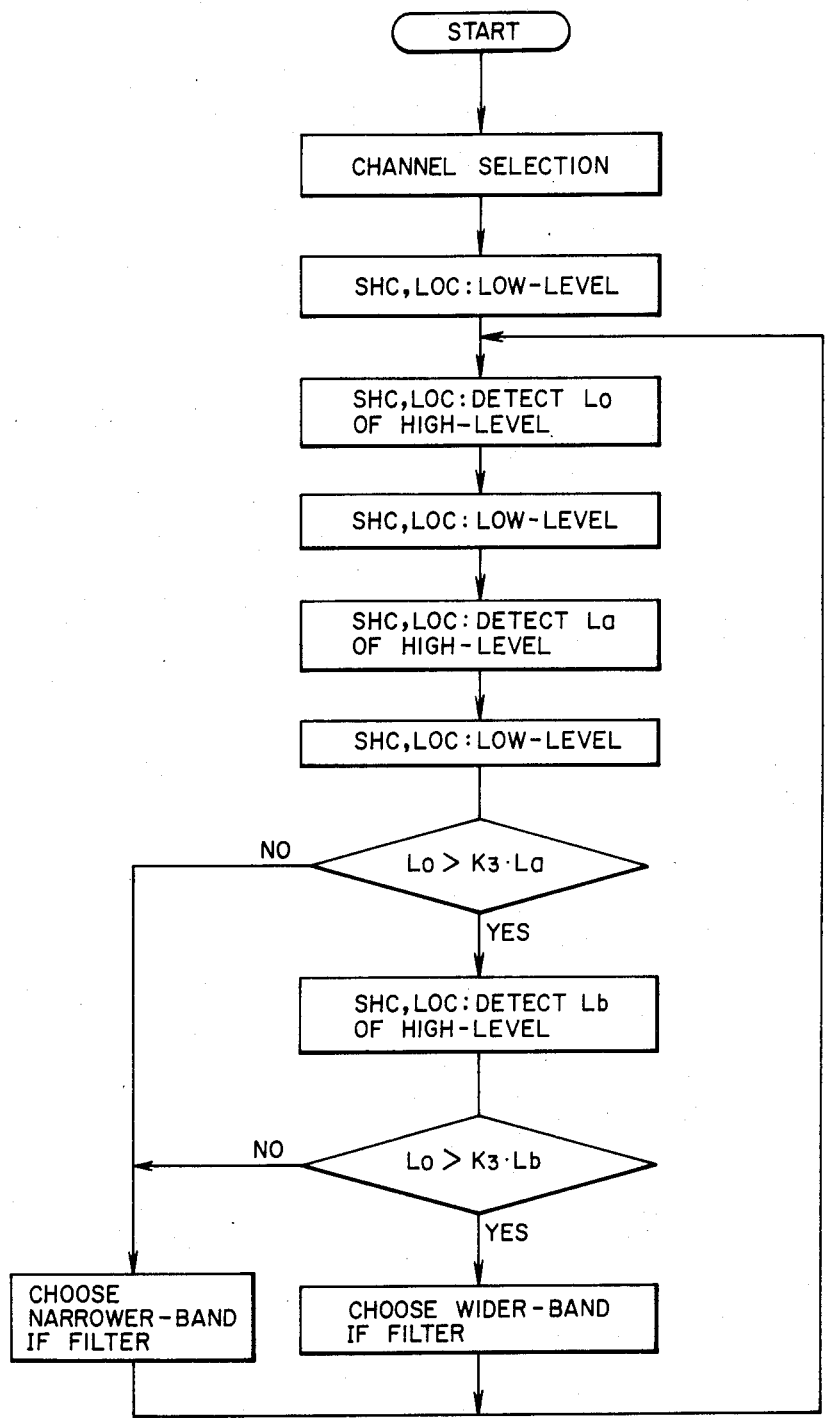
FIG. 19 is a flowchart of intermediate-frequency-band switching for the fifth FM radio receiver.

FIGS. 17 through 19 are illustrative of a fifth radio receiver according to a fifth embodiment of the present invention. The fifth radio receiver includes a first phase-locked loop PLLP1 (indicated by the dotted line) for causing the local oscillator in a first tuner 11 to oscillate at a frequency dependent on the frequency in a desired channel, a second tuner 21, a level detector 22 for detecting the level of an output signal from the second tuner 21, a second phase-locked loop PLLP2 (indicated by the dot-and-dash line) for enabling the local oscillator in the second tuner 21 to oscillate at a prescribed frequency, and a controller 28. The level detector circuit 22 comprises a filter 22a of a narrow band, a second intermediate-frequency amplifier 22b, a detector 22c, and an A/D converter 22d. An intermediate-frequency signal from the second intermediate-frequency amplifier 22b is detected by the detector 22c, an output signal of which is converted by the A/D converter 22d into a digital value. The first phase-locked loop PLLP1 is composed of the local oscillator 11b in the first tuner 11, a local oscillator switching circuit 23, a frequency-divider circuit 29, a PLL circuit 30, a low-pass filter 31, and a sample-and-hold circuit 24. The second phase-locked loop PLLP2 comprises the local oscillator 21b in the second tuner 21, a local oscillator switching circuit 23, a frequency-divider circuit 29, a PLL circuit 30, and a low-pass filter 31. The controller 28 issues a sample-and-hold command SHC at constant periods (shown in FIG. 18) to the sample-and-hold circuit 24, and also issues a local oscillator switching command LOC to the switching circuit 23. When the sample-and-hold command SHC is of a low level (at this time an output signal from the local oscillator 11b is applied to the PLL circuit 30 through the switching circuit 23 and the frequency-divider circuit 29), the controller 28 applies frequency control data FCD to the frequency-divider unit FDV in the PLL circuit 30 for enabling the first tuner 11 to receive and deliver a desired freuency $f_0$ in a desired channel. When the local oscillator switching command LOC is high in level (at this time an output signal from the local oscillator 21b is applied to the PLL circuit 30 through the switchinig circuit 23 and the frequency-divider circuit 29), the controller 28 applies frequency control data FCD for enabling the second tuner 21 to receive and deliver the frequency $f_0$ in the desired channel and first and second frequencies $f_1$, $f_2$ in other channels, successively.

While the sample-and-hold command SHC and the local oscillator switching command LOC are low in level, the controller 28 applies frequency control data FCD to the PLL circuit 30 for enabling the first tuner 11 to receive and issue the signal of the desired frequency $f_0$. As a result, the local oscillator 11b oscillates at a constant frequency higher than the desired frequency $f_0$ by the intermediate frequency. The first tuner 11 receives and issues a signal in the desired channel, and a loudspeaker (not shown) generates sounds in the desired channel.

Under the foregoing condition, the controller 28 first issues a sample-and-hold command SHC of a high level at timing (time $t_1$) as shown in FIG. 18. As the sample-and-hold command SHC goes high, the sample-and-hold circuit 24 samples and holds an output from the low-pass filter 31. The held value is continuously applied to the local oscillator 11b until the sample-and-hold command SHC goes low, to enable the local oscillator 11b to oscillate at a frequency dependent on the held value. The period in which the sample-and-hold command SHC is high is short, and the held value can be regarded as constant. Therefore, the first tuner 11 receives and issues the desired frequency signal properly even during the period.

Then, the controller 28 applies a local oscillator switching command LOC of a high level to the switching circuit 23 at a time $t_2$ shown in FIG. 18, and applies frequency control data FCD dependent on the desired frequency to the PLL circuit 30. As a consequence, the local oscillator 21b in the second tuner 21 oscillates at a frequency higher than the desired frequency $f_0$ by the intermediate frequency under the control of the second phase-locked loop PLLP2. The level detector circuit 22 detects the level of the signal of the desired frequency. The controller 28 reads the signal level as the received level $L_0$ of the desired frequency $f_0$ and stores the same into the memory 28a.

Thereafter, the controller 28 renders the local oscillator switching command LOC and the sample-and-hold command SHC low in level, and applies frequency control data FCD to the PLL circuit 30 for enabling the first tuner 11 to receive the desired frequency $f_0$.

Subsequently, similar control is effected to read the levels $L_1$, $L_2$ of the first and second jamming singals in the adjacent jamming channels, and then selects an IF filter using the levels $L_0$, $L_1$, $L_2$.

Operation of the radio receiver shown in FIG. 17 will be described with reference to the flowchart of FIG. 19.

(a) A channel selection switch (not shown) is depressed to select a channel, and channel selection information is given to the controller 28.

(b) The controller 28 renders both the sample-and-hold command SHC and the local oscillator switching command LOC low in level, and applies frequency control data FCD to the PLL circuit 30 for enabling the first tuner 11 to receive a desired signal of a frequency $f_0$ from the selected channel. The first tuner 11 now receives and issues the desired signal.

(c) Then, after a given period of time or at a time $t_1$, the controller 28 renders the sample-and-hold command SHC high to enable the sample-and-hold circuit 24 to sample and hold an output voltage from the PLL circuit 30. Until the sampled and held value goes low, the sample-and-hold circuit 24 continuously applies the held value to the local oscillator 11b to cause the latter to oscillate based on the held value for enabling the first tuner 11 to receive the desired signal.

(d) At a time $t_2$ after the sample-and-hold command has been issued, the controller 28 renders the local osicllator switching command LOC high in level to cause the switching circuit 23 to apply an output signal from the local oscillator 21b in the second tuner 21 to the PLL circuit 30. At the same time, the controller 28 applies prescribed frequency control data FCD to the PLL circuit 30 for enabling the second tuner 21 to receive the desired frequency, and reads an output signal representative of a received level $L_0$ of the desired frequency $f_0$ from the level detector circuit 22 and stores the same into the memory 28a.

(e) After the level $L_0$ has been detected, the controller 28 successively renders the local oscillator switching command LOC and the sample-and-hold command SHC low, closes the first phase-locked loop PLLP1, and enables the first tuner 11 to receive the desired frequency.

(f) Upon elapse of prescribed times, or at times $t_3$, $t_4$, the controller 28 renders the sample-and-hold command SHC and the local oscillator switching command LOC high successively. The controller 28 applies prescribed frequency control data FCD to the PLL circuit 30 for enabling the second tuner 21 to receive a jamming signal (of a frequency $f_a$) from a first adjacent channel, and reads an output signal indicative of a level $L_a$ from the level detector circuit 22 into the memory 28a.

(g) After the level $L_a$ has been detected, the controller 28 renders the local oscillator switching command LOC and the sample-and-hold command SHC low successively, and applies frequency control data FCD dependent on the desired signal to the PLL circuit 30 for causing the first tuner 11 to receive the desired frequency. The controller 28 at the same time determines whether the inequality (5) is met. If the inequality (5) is not met, then intermodulation interference is caused by the first adjacent jamming channel, and the controller 28 applies an intermediate-frequency filter selection command CS to the IF filter switching circuit 36 to select the IF filter 37b of narrow band. Then, the controller 28 repeats the steps following the step (c). If the inequality (5) is met, then no intermodulation interference is produced by the first adjacent jamming channel, and the controller 28 checks whether there is intermodulation interference caused by a second adjacent jamming channel through the following steps:

(h) At prescribed times $t_5$, $t_6$, the controller 28 renders the sample-and-hold command SHC and the local oscillator switching command LOC high successively. The controller 28 applies prescribed frequency control data FCD to the PLL circuit 30 for enabling the second tuner 21 to receive a jamming signal (of a frequency $f_b$) from the second adjacent channel, and reads an output signal indicative of a level $L_b$ from the level detector circuit 22 into the memory 28a.

(i) After the level $L_b$ has been detected, the controller 28 renders the local oscillator switching command LOC and the sample-and-hold command SHC low successively, and applies frequency control data FCD dependent on the desired signal of the frequency $f_0$ to the PLL circuit 30 for causing the first tuner to receive the desired signal. The controller 28 at the same time determines whether the inequality (6) is met. If the inequality (5) is not met, then intermodulation interference is caused by the second adjacent jamming channel, and the controller 28 applies an intermediate-frequency filter selection command CS to the IF filter switching circuit 36 to select the IF filter 37b of narrower band. Then, the controller 28 repeats the steps following the step (c).

(j) If the inequality (6) is met, then no intermodulation interference is produced by the first adjacent jamming channel, and the controller 28 applies an intermediate-frequency filter selection command CS to the IF filter switching circuit 36 to select the IF filter 37a of wider band. Then, the controller 28 repeats the steps following the step (c). By effecting the step (j), an output terminal of the first tuner 11 is connected to an input terminal of the first intermediate-frequency amplifier 12 through the narrower-band IF filter 37a.

As described above, the fifth radio receiver includes, in addition to a first tuner for receiving and issuing a desired signal, a second tuner and a level detector for detecting the levels of signals from desired and jamming channels. An IF filter is selected on the basis of the levels of the desired and jamming signals from the second tuner. Therefore, the signal levels in the respective channels can be detected without affecting the reception of the desired signal by the first tuner, so that signals in the desired channel can be received well without suffering from sound interruption or noise due to detection of the signal levels.

Figure 20:
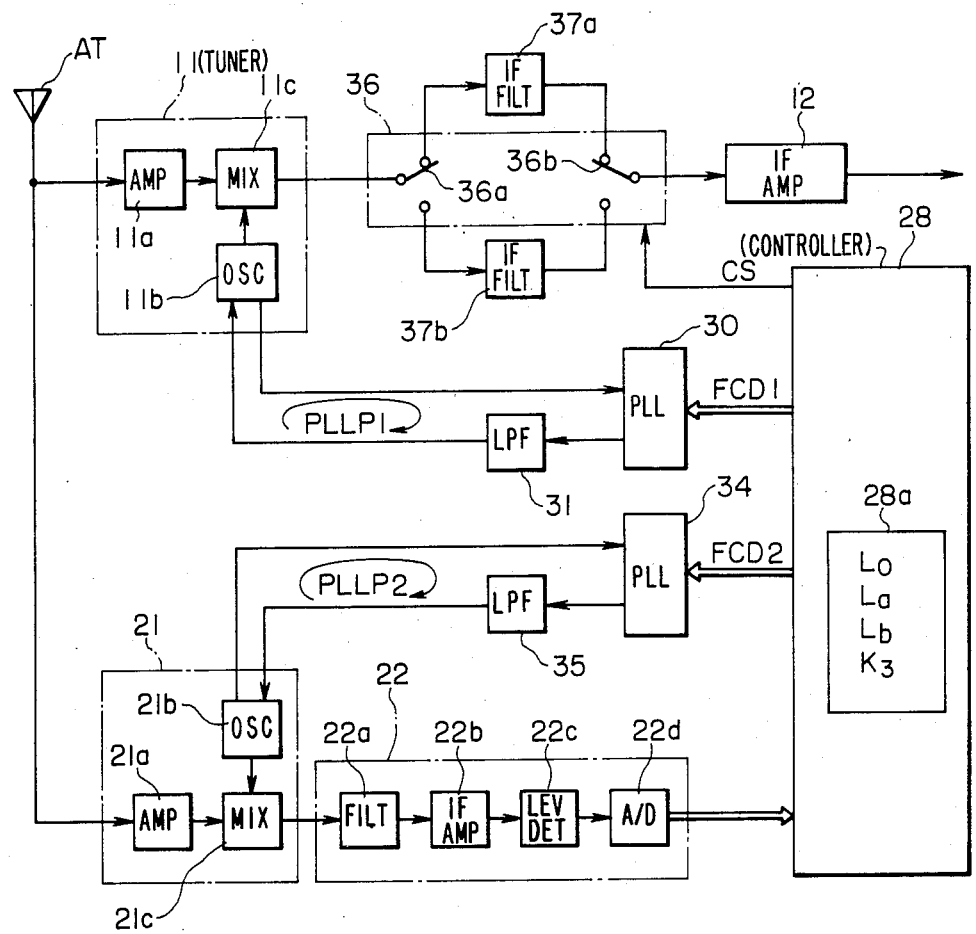
FIG. 20 is a block diagram of a sixth FM radio receiver according to a sixth embodiment of the present invention.
Figure 21:
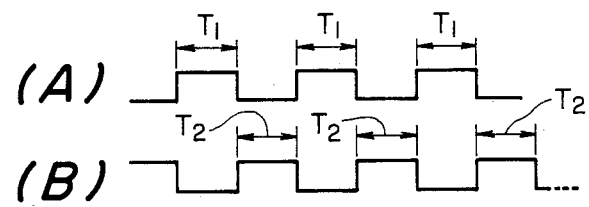
FIGS. 21A and B are timing charts illustrative of detection of the levels of received desired and jamming signals.
Figure 22:
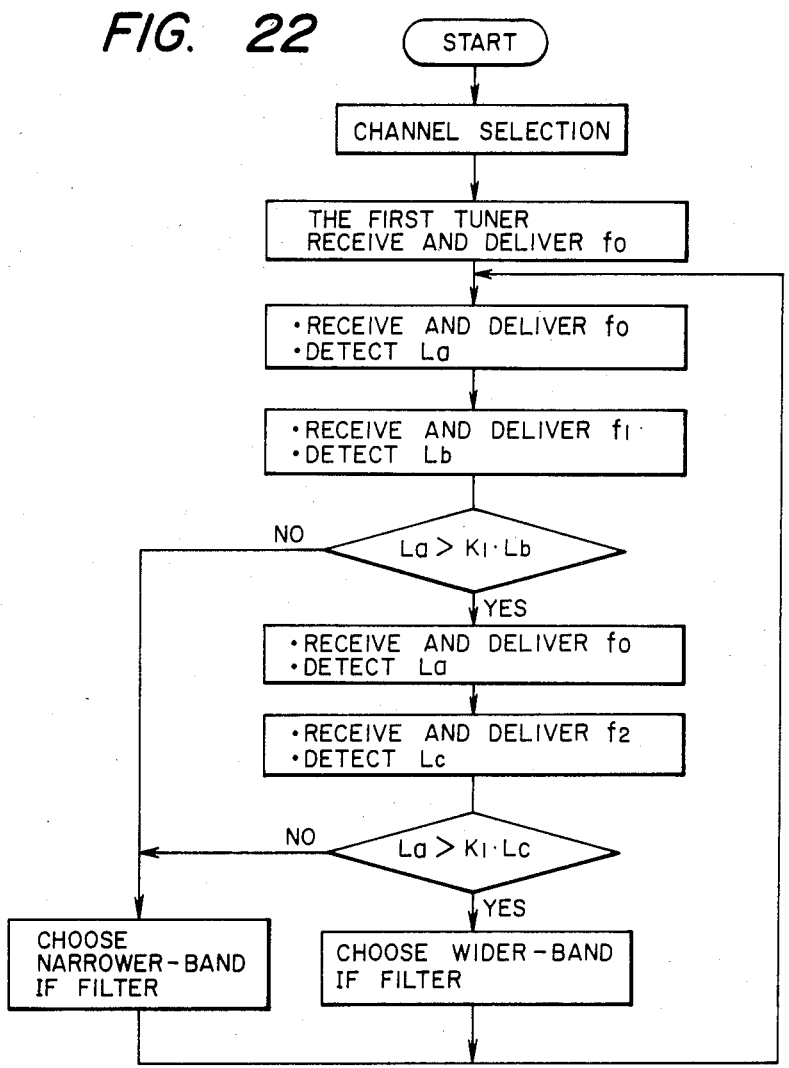
FIG. 22 is a flowchart of intermediate-frequency-band switching operation for the sixth FM radio receiver.

FIGS. 20 through 22 are illustrative of a fixth radio receiver according to a sixth embodiment of the present invention. The sixth radio receiver includes a first phase-locked loop PLLP1 for enabling the local oscillator in the first tuner 11 to oscillate at a frequency dependent on the frequency in a desired channel, and a second phase-locked loop PLLP2 for enabling the local oscillator in the second tuner 21 to oscillate at a prescribed frequency. The first phase-locked loop PLLP1 is composed of the local oscillator 11b in the first tuner, a PLL circuit 30, and a low-pass filter 31 for controlling the oscillation frequency of the local oscillator 11b to be higher than a frequency $f_0$ in the desired channel by an intermediate frequency at all times. More specifically, the first phase-locked loop PLLP1 controls the oscillation frequency of the local oscillator 11b based on first frequency control data FCD1 dependent on a desired frequency commanded by the controller 28 to the PLL circuit 30 for increasing the oscillation frequency of the local oscillator 11b to be higher than the frequency $f_0$ in the desired channel by the intermediate frequency at all times. The second phase-locked loop PLLP2 is composed of the local oscillator 21b in the second tuner, a PLL circuit 34, and a low-pass filter 35 for controlling the oscillation frequency of the local oscillator 21b to be equalized to a frequency dependent on second frequency control data FCD commanded by the controller 28 to the PLL circuit 30.

The controller 28 applies the first frequency control data FCD1 to the PLL circuit 30 for enabling the first tuner 11 to receive and issue a desired signal of a frequency $f_0$ from a desired channel, and also applies the second frequency control data FCD2 to the PLL circuit 34 for enabling the second tuner 21 to receive and issue first and second the desired signal and jamming signals of frequencies $f_a$, $f_b$ from adjacent jamming channels at timing as shown in FIG. 21. More specifically, the controller 28 issues successive second frequency control data FCD2 to the PLL circuit 34 for enabling the second tuner 21 to receive and issue the desired signal during a period $T_1$ and the first or second jamming signal during a period $T_2$.

The level detector circuit 22 detects a level $L_0$ of the desired signal having the frequency $f_0$ during $T_1$, and detects a level $L_a$ or $L_b$ of the first or second jamming signal having the frequency $f_a$ or $f_b$. Digital values of the detected signals are read by the controller 28 and stored in a memory 28a therein.

Operation of the radio receiver shown in FIG. 20 will be described with reference to the flowchart of FIG. 22.

(a) A channel selection switch (not shown) is depressed to select a channel, and channel selection information is given to the controller 28.

(b) The controller 28 applies prescribed first frequency control data FCD1 to the PLL circuit 30 for enabling the first tuner 11 to receive a desired signal in the channel selected on the channel selection information. The first tuner 11 then continues to receive the desired signal.

(c) During a period $T_1$ (FIG. 21), the controller 28 applies prescribed second frequency control data FCD2 to the PLL circuit 34 to enable the second tuner 21 to receive and issue a desired signal. The controller 28 reads into its memory 28a an output signal indicative of a level $L_0$ of the received signal from the level detector circuit 22. The controller 28 stores in the memory thereof the relationship between channel selection switches and frequency control data, looks for the frequency control data dependent on the actuated channel selection switch, and applies them as first and second frequency control data to the PLL circuits 30, 34.

(d) Then, during $T_2$ upon elapse of the period $T_1$, the controller 28 applies second frequency control data FCD2 dependent on a first adjacent jamming channel to the PLL circuit 34 for enabling the second tuner 21 to receive and issue a jamming signal (having a frequency $f_a$) of the first adjacent jamming channel. The controller 28 also reads an output signal having a level La of the received signal generated from the level detector circuit 22 at this time into the memory 28a.

(e) After the controller 28 has detected the level La, it determines whether the inequality (5) is met or not. If the inequality (5) is not met, then intermodulation interference is produced by the first adjacent jamming channel. The controller 28 applies a switching signal CS to the switching circuit 36 to select the IF filter 37b of narrower band and repeats the steps following the step (c). If the inequality (5) is met, then no intermodulation interference is caused by the first adjacent jamming channel, and the controller 28 checks whether intermodulation interference is caused by a second adjacent jamming channel, by effecting the following steps:

(f) During a next period $T_1$, the controller 28 applies prescribed second frequency control data FCD2 to the PLL circuit 34 to enable the second tuner 21 to receive and issue a desired signal. The controller 28 reads into its memory 28a an output signal indicative of a level $L_0$ of the received signal from the level detector circuit 22.

(g) Then, during $T_2$ upon elapse of the period $T_1$, the controller 28 applies second frequency control data FCD2 dependent on a second adjacent jamming channel to the PLL circuit 34 for enabling the second tuner 21 to receive and issue a jamming signal (having a frequency $f_b$) of the second adjacent jamming channel. The controller 28 also reads an output signal having a level Lb of the received signal generated from the level detector circuit 22 at this time into the memory 28a.

(h) After the controller 28 has detected the level Lb, it determines whether the inequality (6) is met or not. If the inequality (6) is not met, then intermodulation interference is produced by the second adjacent jamming channel. The controller 28 applies a switching signal CS to the switching circuit 36 to select the IF filter 37b of narrower band and repeats the steps following the step (c).

(i) If the inequality (6) is met, then no intermodulation interference is caused by the second adjacent jamming channel. The controller 28 applies a switching signal CS to the switching circuit 36 to select the IF filter 37a of wider band and repeats the steps following the step (c).

In the above description, only one controller 28 is employed. However, two controllers may be provided, and the first controller may be programmed to execute a PLL synthesizing process for enabling the first tuner to receive the frequency singal in the selected channel, and the second controller may be programmed to detect the signal levels in the desired and jamming channels and also to effect automatic switching between intermediate-frequency bands. As described above, the sixth radio receiver has the same advantages as those of the fourth and fifth radio receivers.

Figure 24:
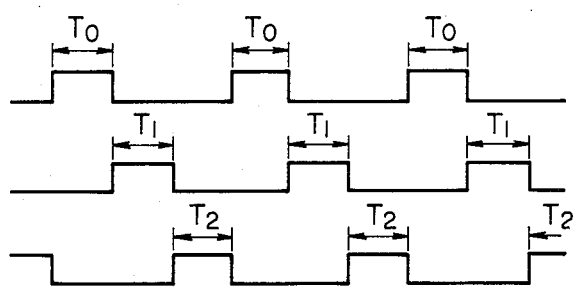
FIG. 24 is a timing chart illustrative of detection of the level of a received signal from each channel.
Figure 25:
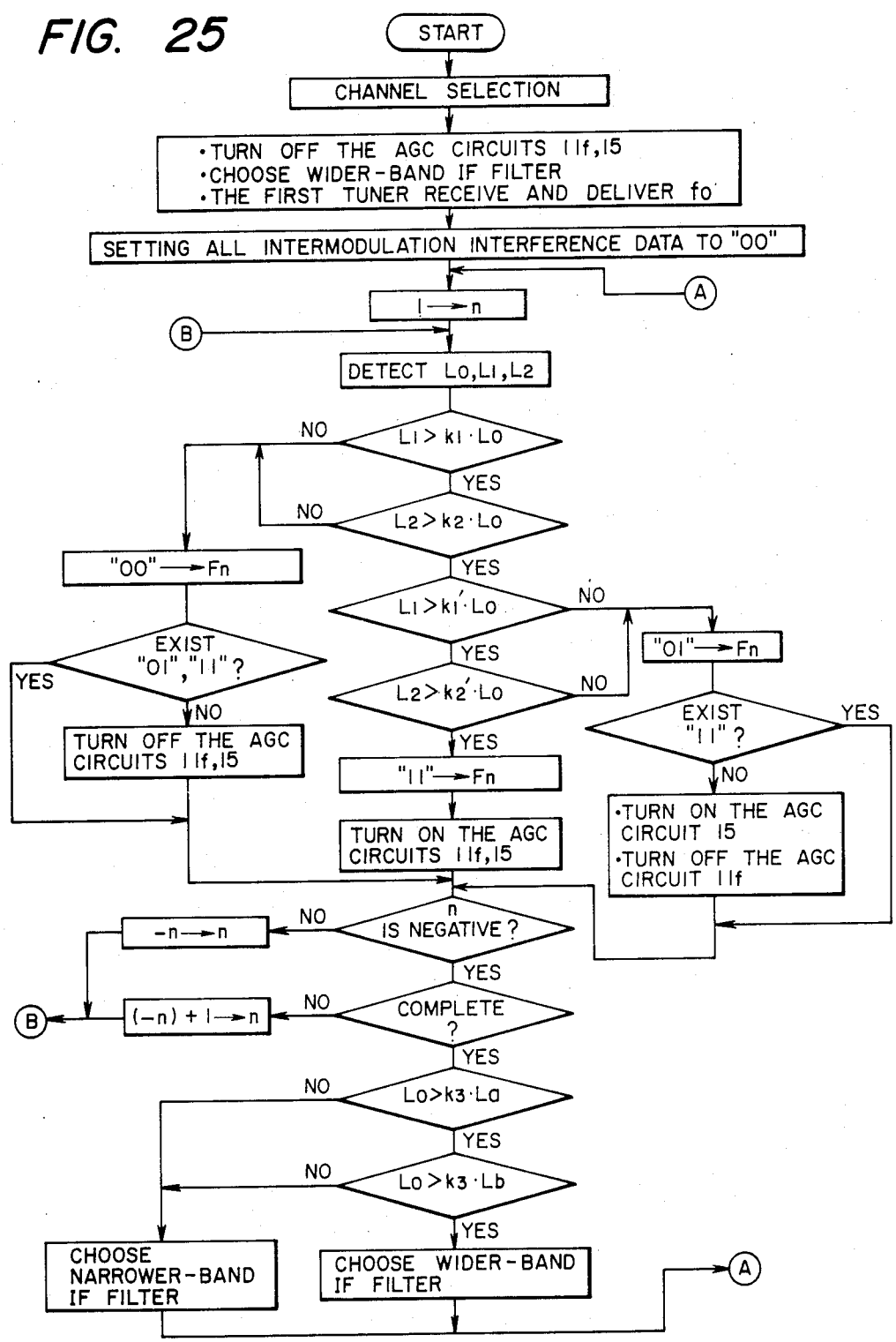
FIG. 25 is a flowchart of AGC and automatic intermediate-frequency-band switching control for the seventh FM radio receiver.

FIGS. 23 through 25 are illustrative of a seventh FM radio receiver according to a seventh embodiment of the present invention.

The seventh FM radio receiver includes a controller 28 for applying first frequency control data FCD1 to a PLL circuit 30 for enabling a first tuner 11 to receive and issue a desired signal of a frequency $f_0$ from a desired channel at all times, and also applies second frequency control data FCD2 to a PLL circuit 34 for enabling a second tuner 21 to receive and issue, at prescribed periods, the desired signal from the desired channel, signals from adjacent jamming channels, and signals from other channels involved in intermodulation interference.

Operation of the seventh RM radio receiver of FIG. 23 will be described with reference to the flowchart of FIG. 25.

(a) A channel selection switch (not shown) is depressed to select a channel, and channel selection information is given to the controller 28.

(b) Then, the controller 28 initially de-energizes the AGC circuits 11f, 15, and causes the switching circuit 36 to select the IF filter 37a of wider band. The controller 28 also issues first frequency control data FCD1 to the PLL circuit 30 to enable the first tuner 11 to receive a signal from a desired channel.

(c) The controller 28 then sets all intermodulation interference data stored in the memory therein to "00", and also sets 1→n.

(d) Thereafter, the controller 28 applies second frequency control data FCD2 to the PLL circuit 34 for enabling the second tuner 21 to receive the desired signal during a period $T_0$ shown in FIG. 24, and reads an output signal of a level $L_0$ from the level detector circuit 22 into the memory 28a.

(e) The controller 28 generates prescribed second frequency control data FCD2 during a time T1 to enable the second tuner 21 to receive a signal from another channel which has a frequency $f_1$ given by:

$$f_0 + n \cdot f_c \rightarrow f_1$$

and stores a level $L_1$ of the received signal. When n $= \pm 1$, the signal level becomes $L_a$, $L_b$ which are levels of signals received in first and second adjacent jamming channels.

(f) After the level $L_1$ has been detected, the controller 28 enables the second tuner 21 to receive a signal having a frequency $f_2$ given by:

$$f_0 + 2 n \cdot f_c \rightarrow f_2$$

and stores a level $L_2$ of the received signal.

(g) When the level $L_2$ is detected, the controller 28 determines whether the inequality (9) is met or not.

(h) If the inequality (9) is not met, then any intermodulation interference is not produced by the frequencies $f_1$, $f_2$, and the controller 28 sets intermodulation interference data Fn to "00" and simultaneously checks whether other intermodulation interference data are all "00". If the other intermodulation interference data are all "00", then the controller 28 applies an AGC switching signal CS to the AGC switching circuit 32 to de-energize the AGC circuits 11f, 15. If at least one intermodulation interference data is "01" or "11", then the controller 28 does not change the state of the AGC circuits 11f, 15 and jumps to a step (p).

(i) If the inequality (9) is met, it is possible that intermodulation interference may be produced by the frequencies $f_1$, $f_2$, and the controller 28 executes the steps described below. The controller 28 determines whether the inequality (10) is met or not:

(j) If the inequality (10) is not met, then the controller 28 sets the intermodulation interference data Fn to "00" and simultaneously checks whether other intermodulation interference data are all "00". If the other intermodulation interference data are all "00", then the controller 28 de-energizes the AGC circuits 11f, 15. If at least one intermodulation interference data is "01" or "11", then the controller 28 does not change the state of the AGC circuits 15, 11f, and jumps to the step (p).

(k) If the inequlity (10) is met, intermodulation interference is produced, and the controller 28 effects the following AGC steps: The controller 28 determines whether the inequalities (11), (12) are met or not by using the levels $L_0$, $L_1$, $L_2$ stored in the memory 28a.

(m) In case one of the inequalities (11), (12) is not met, the extent of intermodulation interference is not strong. Therefore, the controller 28 sets the intermodulation interference data Fn to "01", and simultaneously checks whether there is "11" in other intermodulation interference data Fn. If there is no "11" in the other intermodulation interference data Fn, then the controller 28 applies an AGC switching signal CS to the AGC switching circuit 32 to energize the AGC circuit 15 and de-energize the AGC circuit 11f. If at least one of the intermodulation interference data is "11", the controller 28 does not change the state of the AGC circuits 15, 11f, and jumps to the step (p).

(n) In the event both inequalities (11), (12) are met, the extent of intermodulation interference is strong, and the controller 28 sets the intermodulation interference data Fn to "11". At the same time, the controller 28 applies an AGC switching signal CS to the AGC switching circuit 32 to energize both AGC circuits 15, 11f. Then, the controller 28 effects the step (p).

(p) The controller 28 determines whether n is negative or not. If positive, then the controller 28 sets $-n \to n$ and repeats the steps following the step (d). If negative, the controller 28 repeats the steps following the step (q).

(q) If n is negative in the step (p), the controller 28 determines whether the steps following the step (d) have been completed for all frequencies involved in intermodulation interference.

(r) If the steps following the step (d) have been completed for all frequencies, then the controller 28 determines whether the inequality (5) is met or not by using the levels $L_a$, $L_b$ (which are the same as $L_1$ at $n=1, -1$) of the signals received from the adjacent jamming channels and the level $L_0$ of the desired signal, the levels being stored in the memory 28a. If the inequality (5) is not met, then intermodulation interference is produced by the first adjacent jamming channel. The controller 28 applies a switching signal FCS to the switching circuit 36 to select the IF filter 37b of narrower band, sets $1 \to n$, and repeats the steps following the step (d).

If the inequality (5) is met, then no intermodulation interference is caused by the first adjacent jamming channel, and the controller 28 checks whether intermodulation interference is caused by a second adjacent jamming channel, by effecting the following steps: The controller 28 determines whether the inequality (6) is met or not. If the inequality (6) is not met, then intermodulation interference is produced by the second adjacent jamming channel. The controller 28 applies a switching signal FCS to the switching circuit 36 to select the IF filter 37b of narrower band, sets $1 \to n$, and repeats the steps following the step (d).

If the inequality (6) is met, then no intermodulation interference is caused by the second adjacent jamming channel. The controller 28 applies a switching signal FCS to the switching circuit 36 to select the IF filter, 37a of wider band, sets $1 \to n$, and repeats the steps following the step (d).

(s) If the steps following the step (d) have not yet been completed as determined in the step (q), then the controller 28 increments n by 1 according to the following equation:

$$(-n) + 1 \to n$$

and repeats the steps following the step (d).

While the seventh embodiment has been described as being applied to an FM radio receiver, the invention is also applicable to an AM radio receiver. Furthermore, although the two AGC circuits are shown to provide three AGC modes, the invention is not limited to such an arrangement, but may be subjected to changes and modifications.

Although two IF filters having different frequency bands have been described above, the present invention is not limited to two IF filters, but three or more IF filters may be provided. With such an alternative, a plurality of inequalities are provided which include different constants $k_3$ as in the inequalities (5), (6), and a desired IF filter can be selected dependent on whether such a plurality of inequalities are met or not.

As described above, the seventh FM radio receiver allows appropriate automatic gain control and selection of a suitable IF filter to be effected through a common circuit arrangement for thereby automatically providing an optimum signal receiving condition.

The construction of the seventh FM radio receiver is simplified since a common circuit arrangement is employed for determining whether there is intermodulation interference, whether there is signal interferencce from an ajacent jamming channel, for effecting automatic gain control, and for selecting an appropriate IF filter.

The seventh FM radio receiver has first and second tuners, with the first tuner effective in receiving a desired signal at all times and the second tuner in detecting the levels of signals received in respective channels. Therefore, the signal levels can be detected without affecting in any way the reception of the desired signal, and the degree of intermodulation interference and interference from an adjacent jamming channel can reliably be checked.

The radio receiver shown in FIG. 23 is a combination of the radio receivers shown in FIGS. 11 and 20. The radio receivers of FIGS. 4 and 14, or the radio receivers of FIGS. 8 and 17 may also be combined to provide a common circuit arrangement for determining whether there is intermodulation interference, whether there is signal interferencce from an ajacent jamming channel, for effecting automatic gain control, and for selecting an appropriate IF filter.

Although certain preferred embodiments have been shown and described, it should be understood that many changes and modifications may be made therein without departing from the scope of the appended claims.

What is claimed is:

1. A radio receiver comprising first and second turner, an automatic gain control circuit for controlling the gain of said first tuner, first and second phase-locked loops sharing a single phase-locked loop circuit and connected respectively with said first and second tuners, a level detector circuit connected to an output of said second tuner, a switching circuit for applying an ouput signal from a local oscillator in a selected one of said first and seond tuners to said phase-locked loop circuit, a sample-and-hold circuit connected in said first phase-locked loop for sampling and holding an ouput voltage from said phase-locked loop circuit, and a controller receiving an output of said level detector circuit for generating a sample-and-hold command to enable said sample-and hold circuit to sample and hold the output voltage from said phase-locked loop circuit, for applying the held output voltage to the local oscillator in said first tuner, for enabling said switching circuit to apply an output signal from the local oscillator in said second tuner to said phase-locked loop circuit, for enabling said second tuner to receive signals from other channels involved in intermodulation interfence at prescribed periods, for enabling said level detector circuit to detect the levels of signals in a desired channel and the other channels from said second tuner, and for controlling said automatic gain control circuit based on the detected levels of the signals.

2. A radio receiver comprising a first tuner, a first intermediate-frequency amplifier circuit, an automatic gain control circuit for controlling the gain of said first tuner, a first phase-locked loop circuit for causing a local oscillator in said first tuner to oscillate at a frequency dependent on the frequency in a desired channel, a second tuner connected to a second intermediate-frequency amplifier circuit, a level detector circuit for detecting the level of an intermediate-frequency signal produced by said second intermediate-frequency amplifier circuit, a second phase-locked loop circuit for causing a local oscillator in said second tuner to oscillate at a prescribed frequency, and a controller receiving an output of said level detector circuit for applying first frequency control data to said first phase-locked loop circuit to enable said first tuner to receive and deliver a desired frequency signal, for applying second frequency control data to said second phase-locked loop circuit to enable said second tuner to receive and deliver signals from the desired channel and from other channels involved in intermodulation interference at prescribed periods, for enabling said level detector circuit to detect the levels of the signals from the desired channel and the other channels, and for controlling said automatic gain control circuit based on the detected levels of the signals including the signal from the desired channel.

3. A radio receiver comprising a first tuner for receiving and delivering a desired signal, a first intermediate-frequency amplifier, at least two intermediate-frequency filters connected between said first tuner and said first intermediate-frequency amplifier and having different frequency bands, a first switching circuit responsive to an intermediate-frequency filter selection command for applying an output signal from said first tuner through a selected one of said intermediate-frequency filters to said first intermediate-frequency amplifier, a second tuner, a level detector for detecting the level of an output signal from said second tuner, first and second phase-locked loops sharing a single phase-locked loop circuit and associated respectively with said first and second tuners, a second switching circuit responsive to a local oscillator switching command for applying an output signal from a local oscillator in one of said tuners, a sample-and-hold circuit connected in said first phase-locked loop for samplig and holding an output voltage from said phase-locked loop circuit in response to a sample-and-hold command and for applying a held value to the local oscillator in said first tuner, and a controller for issuing the sample-and-hold command and the local oscillator switching command, for enabling said second tuner to receive and deliver the desired and jamming signals from adjacent jamming channels, for enabling said level detector circuit to detect the levels of the desired and jamming signals, and for generating the intermediate-frequency filter selection signal based on the detected levels of the desired and jamming signals.

4. A radio receiver comprising a first tuner, a first intermediate-frequency amplifier, at least two intermediate-frequency filters connected between said first tuner and said intermediate-frequency amplifier and having different frequency bands, a first phase-locked loop for causing a local oscillator in said first tuner to oscillate at a frequency dependent on the frequency in a desired channel, a second tuner, a level detector circuit for detecting the level of an output signal from said second tuner, a second phase-locked loop for causing a local oscillator in said second tuner to oscillate at a prescribed frequency, and a controller for controlling said first phase-locked loop to enable said first tuner to receive and deliver a desired signal from the desired channel, for controlling said phase-locked loop to enable said second tuner to receive and deliver at least jamming signals from jamming channels, for enabling said level detector circuit to detect the levels of the jamming signals, and for enabling said switching circuit to apply the output signal from said first tuner through the selected intermediate-frequency filter to said first intermediate-frequency amplifier based on the levels of the desired and jamming signals.

5. A radio receiver comprising a first tuner, a first intermediate-frequency amplifier, at least two intermediate-frequency filters connected between said first tuner and said first intermediate-frequency amplifier and having difference frequency bands, a switching circuit for applying an output signal from said first tuner through a selected one of the intermediate-frequency filters to said first intermediate-frequency amplifier, an automatic gain control circuit for controlling the gain of said first tuner, a first phase-locked loop for enabling a local oscillator in said first tuner to oscillate at a frequency dependent on the frequency of a desired channel, a second tuner, a level detector circuit for detecting the level of an output signal from said second tuner, a second phase-locked loop for enabling a local oscillator in said second tuner to oscillate at a prescribed frequency, and a controller for controlling said first phase-locked loop to enable said first tuner to receive and issue a desired signal from a desired channel, for controlling said second phase-locked loop to enable said second tuner to receive and issue signals from the desired channel and other channels, for enabling said level detector circuit to detect the levels of the received signals of the channels, for selecting said one of the intermediate-frequency filters based on the detected levels of received signals, and for controlling said automatic gain control circuit.

6. A radio receiver according to claim 5, wherein said level detector circuit includes a second intermediate-frequency amplifier and a detector.

* * * * *

UNITED STATES PATENT AND TRADEMARK OFFICE
CERTIFICATE OF CORRECTION

PATENT NO. : 4,654,884
DATED : March 31, 1987
INVENTOR(S) : Tsuneo Sakai; Tadashi Tanihira; Yoshio Ito It is certified that error appears in the above-identified patent and that said Letters Patent is hereby corrected as shown below:

Title page:

The "Assignee" portion should reflect assignment by Inventors to Alpine Electronics, Inc., Japan, as recorded on May 10, 1985, reel/frame 4406/0009.

Signed and Sealed this

Thirteenth Day of December, 1988

*Attest:*

DONALD J. QUIGG

*Attesting Officer*  *Commissioner of Patents and Trademarks*